United States Patent [19]
Saeki

[11] Patent Number: 6,060,920
[45] Date of Patent: May 9, 2000

[54] MULTIPLEX SYNCHRONOUS DELAY CIRCUIT

[75] Inventor: Takanori Saeki, Tokyo, Japan

[73] Assignee: NEC Corporation, Tokyo, Japan

[21] Appl. No.: 08/931,974

[22] Filed: Sep. 15, 1997

[30] Foreign Application Priority Data

Sep. 13, 1996 [JP] Japan ................................. 8-243022

[51] Int. Cl.$^7$ ...................................................... H03L 7/00
[52] U.S. Cl. ......................................... 327/152; 327/293
[58] Field of Search .............................. 327/99, 144, 149, 327/152, 153, 154, 158, 161, 276, 277, 293, 294, 298

[56] References Cited

U.S. PATENT DOCUMENTS

| | | | |
|---|---|---|---|
| 5,544,203 | 8/1996 | Casasanta et al. | 375/376 |
| 5,781,056 | 7/1998 | Fujii | 327/276 |
| 5,889,423 | 3/1999 | Trumpp | 327/298 |

FOREIGN PATENT DOCUMENTS

| | | |
|---|---|---|
| 0 419 896 | 4/1991 | European Pat. Off. . |
| 0 578 437 | 1/1994 | European Pat. Off. . |
| 0 720 291 | 7/1996 | European Pat. Off. . |
| 8237091 | 9/1996 | Japan . |

OTHER PUBLICATIONS

ISSCC96/Session 23/DRAM Paper SP 23.4, 1996 IEEE International Solid–State Circuits Conference, Feb. 10, 1996, pp. 374–375, 0–7803–3136–2/96.

Takanori Saeki et al, "A 2.5–ns Clock Access, 250–MHz, 256–Mb SDRAM with Synchronous Mirror Delay", IEEE Journal of Solid–State Circuits, vol. 31, No. 11, Nov. 1996, 0018–9200/96.

Toshio Yamada et al, Capacitance Coupled Bus with Negative Delay Circuit for High speed and Low Power 910 B/s <500mW) Synchronous DRAMs, IEEE, 1996 Symposium on VLSI Circuits Digest of Technical Papers, pp. 112–113, 0–7803–3339–X/96.

Jin–Man Han et al, "Skew Minimization Techniques for 256M–bit Synchronous DRM and beyond", IEEE, 1996 Symposium on VLSI Circuits Digest of Technical Papers, IEEE, pp. 192–193, 0–7803–3339–X/96.

Richard B. Watson, Jr. et al, "Clock Buffer Chip with Absolute Delay Regulation Over Process and Environmental Variations", IEEE 1992 Custom Integrated Circuits Conference, pp. 25.2.1–25.2.5, 0–7803–0246–X/92.

Primary Examiner—Jeffrey Zweizig
Attorney, Agent, or Firm—Sughrue, Mion, Zinn, Macpeak & Seas, PLLC

[57] ABSTRACT

A synchronous delay circuit of multiplex configuration is disclosed that has a delay time that corresponds to the pulse separation immediately preceding input of the pulse signal. For the purpose of reducing dependence of the delay time differential between the delay signal and the external clock signal upon the external clock signal cycle, the multiplex synchronous delay circuit of this invention is provided with a plurality of synchronous delay circuits; a delay time differential than is smaller that the delay time of each gate section of the delay circuit bank that makes up each of these synchronous delay circuit is arranged at the input/output portion of the signal path of the synchronous delay circuits, and the outputs of these synchronous delay circuits are multiplexed by their logic output.

14 Claims, 26 Drawing Sheets

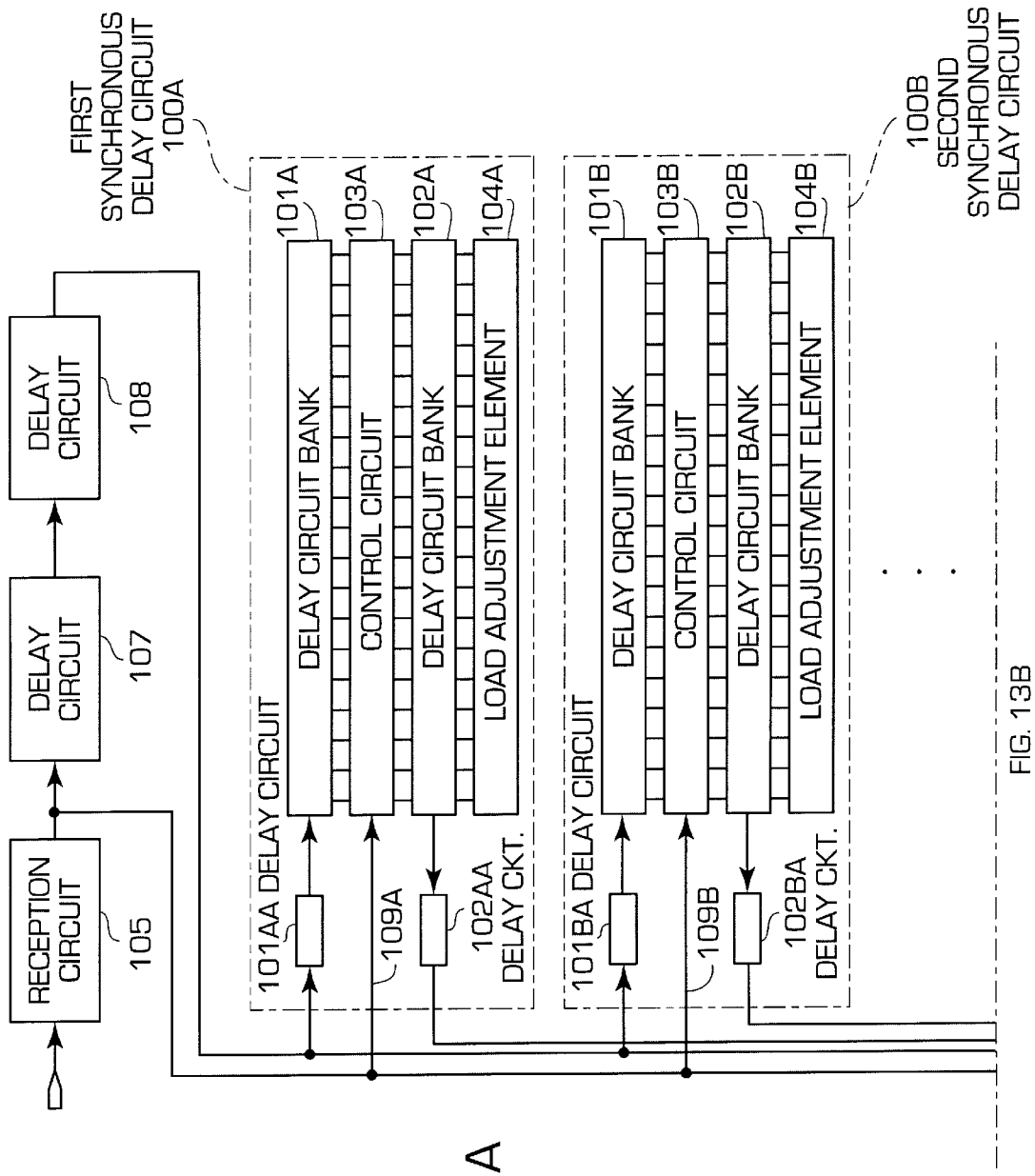

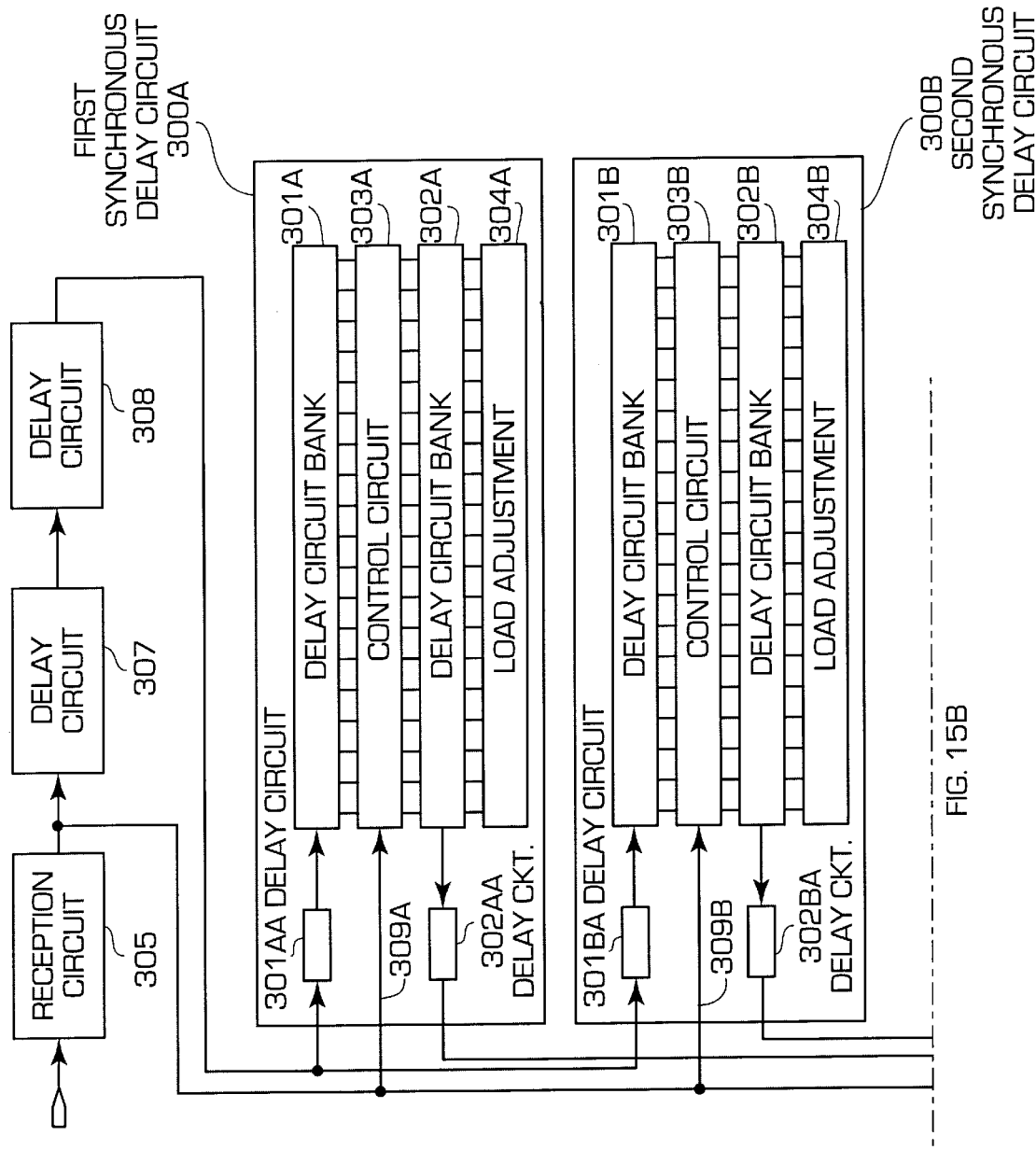

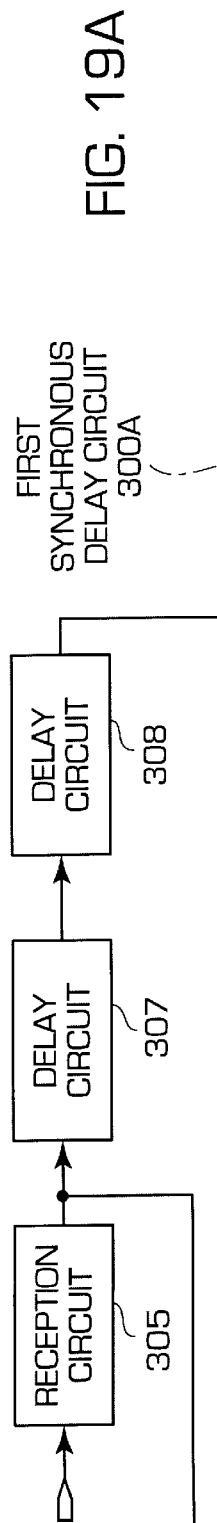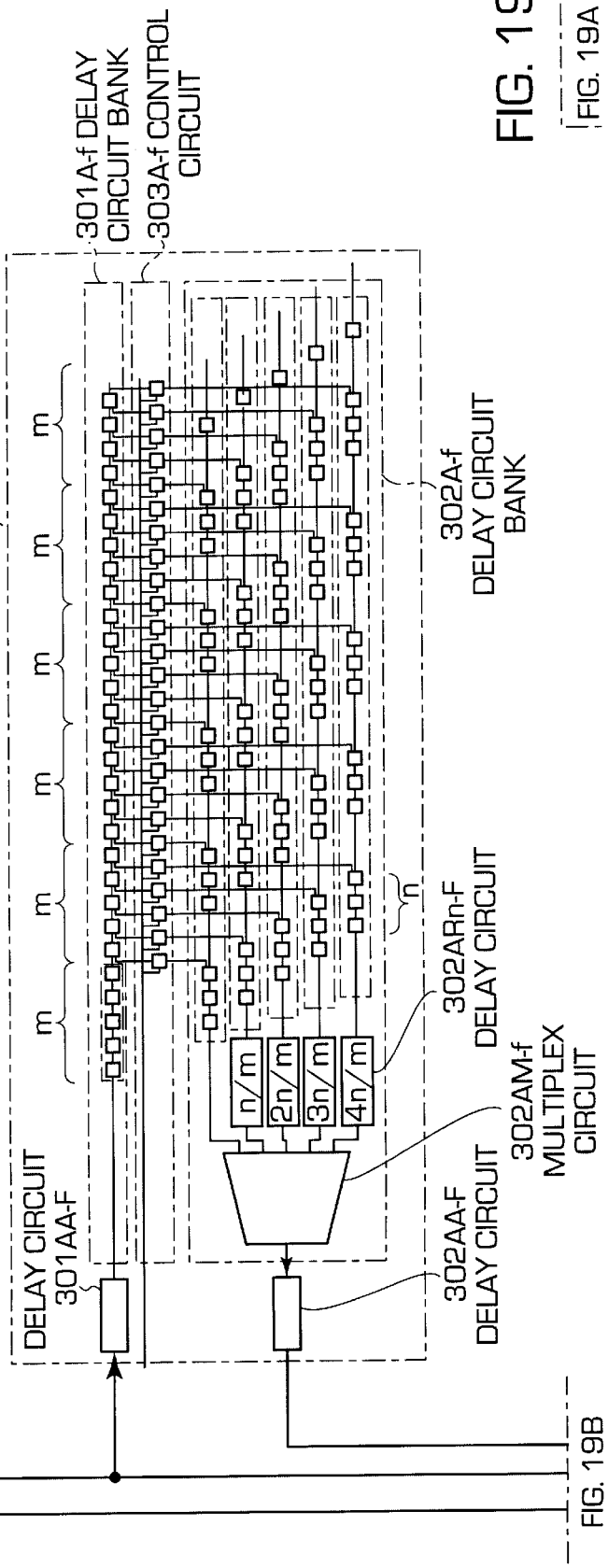

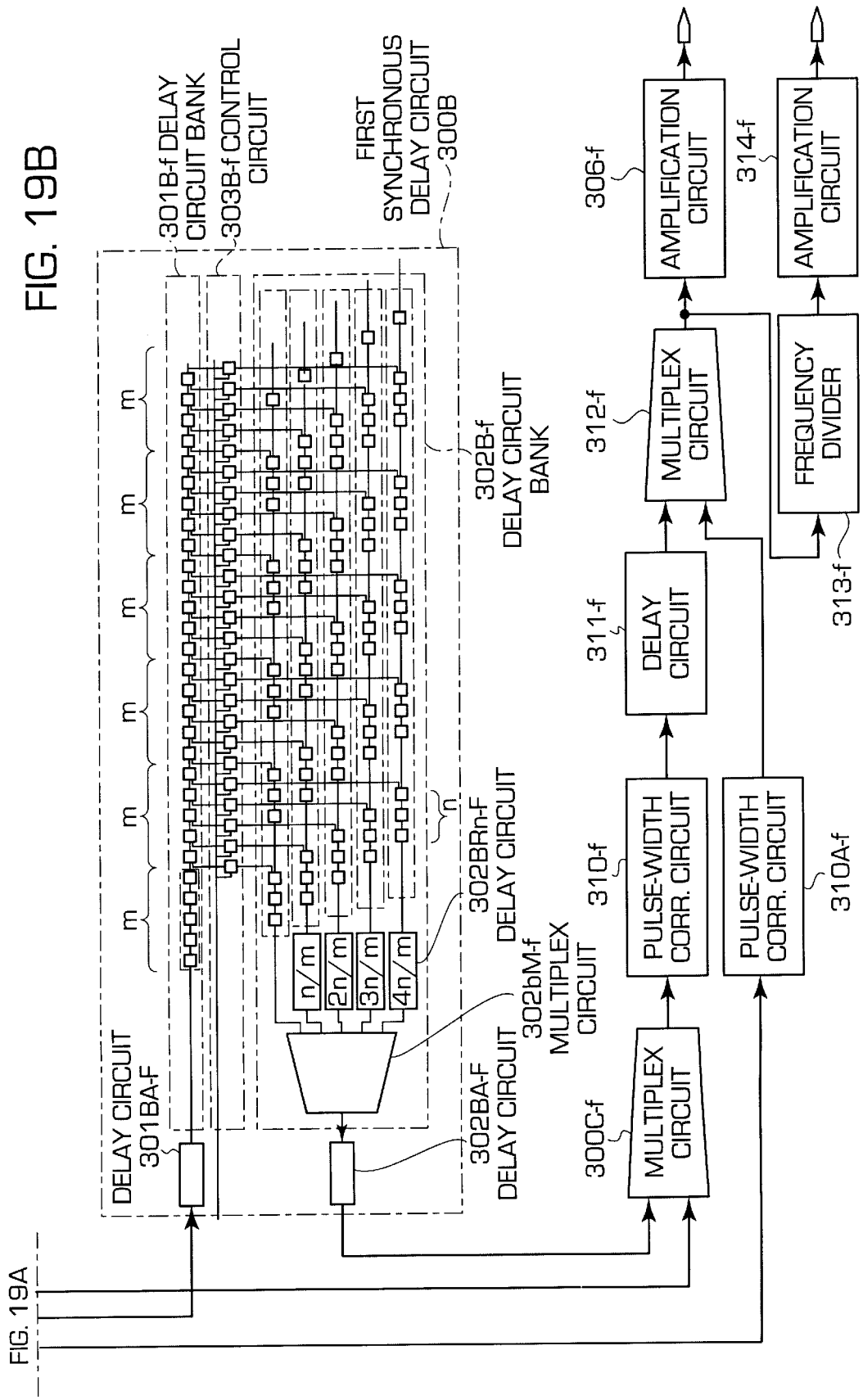

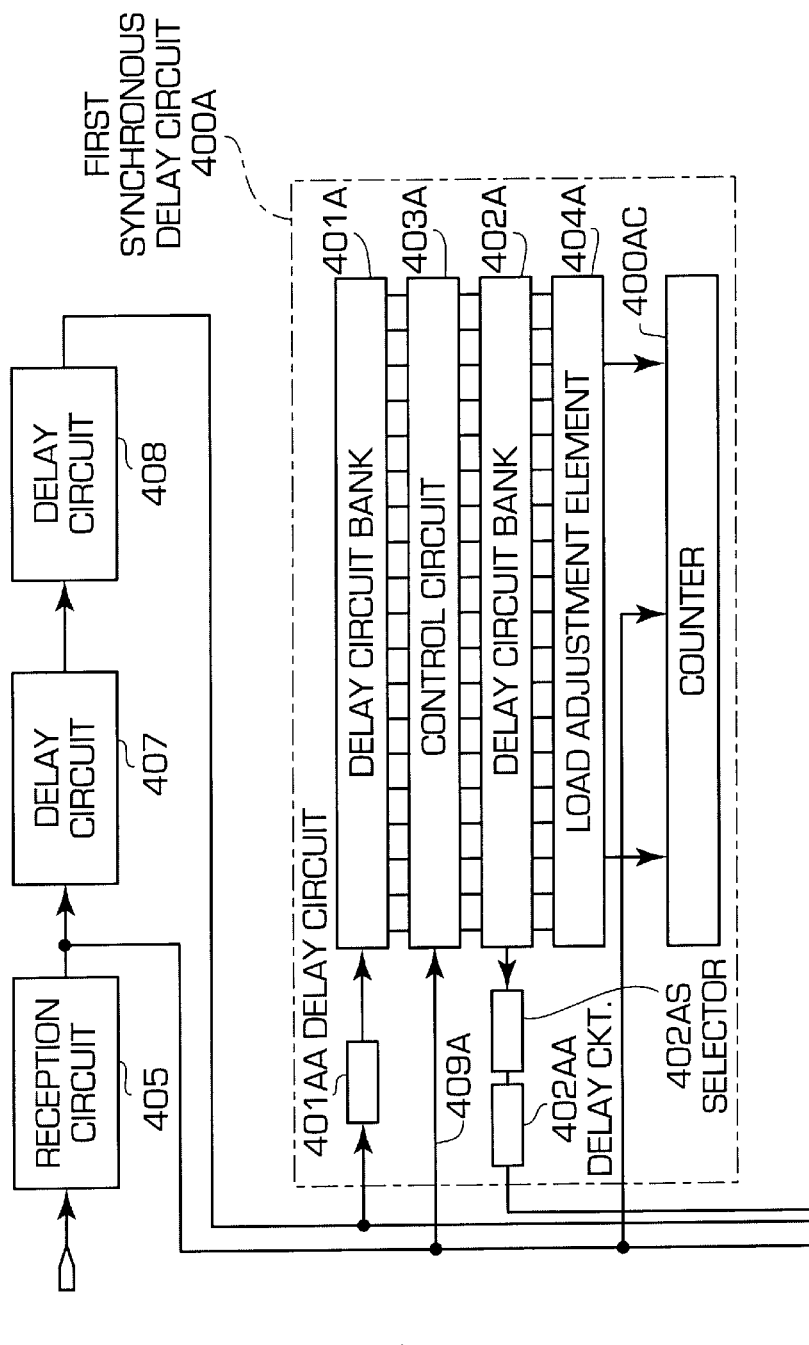

MULTIPLEX SYNCHRONOUS DELAY CIRCUIT

BACKGROUND OF THE INVENTION

1. Field of the Invention

The present invention relates to a synchronous delay circuit of multiplex configuration that outputs delay signals having a delay time corresponding to pulse separation immediately preceding input of the pulse signal.

2. Description of the Related Art

In a semiconductor circuit device using a clock signal, as shown in FIG. 1A, the internal clock signal 708 used in circuit 704 for clock signal control has conventionally been generated by receiving an external clock signal 701 at reception circuit 702, and amplifying at amplification circuit 703. In the process of receiving at reception circuit 702 and amplifying at amplification circuit 703, a delay time 803 was therefore generated between external clock signal 801 and internal clock signal 802, as shown in FIG. 1B. This delay time 803 has grown with the increase in circuit scale of semiconductor circuit devices accompanying developments in manufacturing technology and the increased diameters of semiconductor substrates. In addition, the circuit operation of semiconductor devices and the clock signals employed have also attained higher speeds due to the higher speeds of systems mounted in semiconductor circuit devices. Delay time 803 has consequently become relatively large with respect to clock signal cycle 804 and now presents a barrier to circuit operation.

Phase-locked loops (hereinbelow referred to as "PLL") have come into use as a countermeasure to this problem. FIG. 2 shows the basic circuit structure of a phase-locked loop. Phase comparator 901 outputs phase error signal-906 from the phase difference between external clock signal 903 inputted by way of reception circuit 902 and internal clock signal 905 inputted by way of delay circuit 904 having a delay equivalent to reception circuit 902. Phase error signal 906 passes through loop filter 907 to become control signal 908 and enters voltage-controlled oscillator 909. At voltage-controlled oscillator 909., clock signal 910 having a frequency corresponding to control signal 908 is generated. Clock signal 910 is amplified at amplification circuit 911, and becomes internal clock signal 905 used in circuit 912 for clock signal control. Phase error signal 906 and control signal 908 control voltage-controlled oscillator 909 such that the phase difference between external clock signal 903 and internal clock signal 905 is eliminated, and control voltage-controlled oscillator 909 until phase error finally cannot be detected. A PLL thus eliminates delay between the external clock signal and internal clock signal and circumvents the obstacle to circuit operation posed by the relative increase of delay time with respect to the clock signal cycle.

In semiconductor circuit devices employing a clock signal in which the duty cycle is an integer ratio or a frequency which is an integer power of the external clock signal, configurations have been used in the prior art that incorporate a frequency-dividing circuit in the PLL as shown in FIG. 3.

Delay circuit 1004 has a delay equivalent to that of reception circuit 1002. Phase comparator 1001 outputs phase error signal 1006 from the phase difference between external clock signal 1003 that has passed through reception circuit 1002 and internal clock signal 1005 that has passed through delay circuit 1004. Phase error signal 1006 passes through loop filter 1007, becomes control signal 1008, and enters voltage-controlled oscillator 1009. Voltage-controlled oscillator 1009 generates clock signal 1010 of a frequency corresponding to the voltage of control signal 1008. This clock signal 1010 is frequency-divided by frequency-divider circuit 1013, becomes clock signal 1014, is amplified at amplification circuit 1011, and becomes internal clock signal 1005 used in circuit 1012 for clock signal control. In addition, clock signal 1010 is amplified at amplification circuit 1015 and becomes internal clock signal 1016 used in circuit 1012 for clock signal control.

Phase error signal 1006 and control signal 1008 control voltage-controlled oscillator 1009 so as to eliminate the phase difference between external clock signal 1003 and internal clock signal 1005, and control voltage-controlled oscillator 1009 until phase difference finally cannot be detected.

As a result, clock signal 1005 becomes a clock signal having phase and frequency equal to that of external clock signal 1003, and moreover, having a duty cycle that is an integer ratio. In addition, clock signal 1016 has the same frequency as clock signal 1005 before frequency division, and therefore, becomes a clock signal having a frequency which is an inverse power of the frequency division of the external clock signal.

A circuit employing the above-described PLL has the following drawbacks:

1. A time interval of several tens of cycles is required before the phase difference between the internal clock signal and the external clock signal is eliminated.

2. As a result of the first drawback, the PLL must be operated constantly in order to ensure an internal clock signal having no phase difference with the external clock signal at any desired timing, thereby increasing power consumption.

3. Since the voltage-controlled oscillator controls oscillation by voltage, a decrease in the power source voltage narrows the range of the control voltage and decreases the accuracy of the control frequency.

4. Control over a broad range of frequencies while maintaining the accuracy of the fixed control frequency requires the use of a plurality of voltage-controlled oscillators of differing frequency range, and time is required to eliminate phase difference when voltage-controlled oscillators are changed.

5. The conditions for eliminating phase difference (voltage, device conditions) are limited, require investigation in advance, and this advance investigation is problematic.

6. Numerous types of circuits exist, and dealing with defects is therefore complicated.

One example of a prior-art delay circuit device directed toward solving these drawbacks is described in Japanese Patent Application No. 316875/94 and in "Synchronous Mirror Delay" ("2.5-ns clock access 250-MHz 256 Mb SDRAM with synchronous mirror delay," Takanori Saeki et al., International Solid-State Circuit Conference #23.4, 1996).

This example of a prior-art delay circuit device will be explained with reference to FIG. 4. This delay circuit device of the prior art includes: first delay circuit bank 1101 made up of a plurality of gate sections in cascade connection, that inputs and sequentially delays a signal that corresponds to the pulse signal and that parallel outputs, in order for each gate section from the input side, the output of each gate section; control circuit 1103 that parallel inputs the output of each of the gate sections of the first delay circuit bank 1101, synchronizes with the pulse 2a signal, and parallel outputs each output; second delay circuit bank 1102 made up of a plurality of gate sections in cascade connection arranged in the reverse direction of the signal transmission route of the first delay circuit bank, that parallel inputs to each gate section each output of the control circuit in the order of the gate sections from the output side, sequentially delays these inputs, and outputs the result; load adjustment element 1104; reception circuit 1105 that inputs an external signal and outputs a pulse signal;

an amplification circuit 1106; a delay circuit 1107 having a delay time equivalent to reception circuit 1105; and delay circuit 1108 having a delay time equivalent to amplification circuit 1106. In this case, the output of reception circuit 1105 is connected to the input of delay circuit 1107 and control terminal 1109. In addition, the output of delay circuit 1107 is connected to the input of delay circuit 1108, and the output of delay circuit 1108 is connected to the input of delay circuit bank 1101. The output of delay circuit bank 1102 is connected to the input of amplification, circuit 1106.

Explanation will next be given regarding the internal construction of delay circuit bank 1101, delay circuit bank 1102, control circuit 1103, and load adjustment element 1104 with reference to FIG. 5.

Delay circuit bank 1101 and delay circuit bank 1102 are made up of alternating inverters and NAND circuits. Control circuit 1103 and load adjustment element 1104 are made up of NAND circuits. Delay circuit bank 1101 is constituted by a configuration in which, from the input side, NAND circuits and inverters are connected in the order: NAND circuit FN1, inverter FI1, NAND circuit FN2, inverter FI2, . . . NAND circuit FNn, inverter FIn, NAND circuit FNn+1, inverter FIn+1, and so on. Delay circuit bank 1102 is constituted by a configuration in which, from the output side, NAND circuits and inverters are connected in the order: inverter RI1, NAND circuit RN1, inverter RI2, NAND circuit RN2, . . . inverter RIn, NAND circuit RNn, inverter RIn+1, NAND circuit RNn+1, and so on. Control circuit 1103 is composed of a NAND circuit bank NAND circuit CN1, NAND circuit CN2, . . . NAND circuit CNn, NAND circuit CNn+1, and so on, and having its one input terminal connected to control terminal 1109. Load adjustment element 1104 is composed of a NAND circuit bank NAND circuit GN1, NAND circuit GN2, . . . , NAND circuit GNn, NAND circuit GNn+1, and so on, having its one input terminal connected to ground line 1110.

Next, the mutual connections of delay circuit bank 1101, delay circuit bank 1102, control circuit 1103, and load adjustment element 1104 will be explained with respect to the (n)th element of each.

The output of inverter FIn of delay circuit bank 1101 is connected to both NAND circuit FNn+l and the input terminal of the two input terminals of NAND circuit CNn of control circuit 1103 that is not connected to control terminal 1109. The output of NAND circuit CNn of control circuit 1103 is connected both to the input terminal of the two input terminals of NAND circuit FNn+2 of delay circuit bank 1101 that is not connected to the output of inverter FIn+l, and to the input terminal of the two input terminals of NAND circuit RNn of delay circuit bank 1102 that is not connected to the output of inverter RIn+1. The output of NAND circuit RNn of delay circuit bank 1102 is connected to the input of inverter RIn of delay circuit bank 1102.

The output of inverter RIn of delay circuit bank 1102 is connected both to NAND circuit RNn−1 and to the input terminal of the two input terminals of NAND circuit GNn of load adjustment element 1104 that is not connected to ground line 1110. The output of NAND circuit GNn of load adjustment element 1104 is not connected. Power source line 1111 is connected to the input terminal of the two input terminals of NAND circuit FN1 of delay circuit bank 1101 that is not connected to the input terminal of delay circuit bank 1101, to the input terminal of the two input terminals of NAND circuit FN2 that is not connected to the output of inverter FI1, and to the input of the two inputs of the final NAND circuit of delay circuit bank 1102 that is not connected to the output of the final NAND circuit of control circuit 1103.

Next, regarding the operation of this delay circuit device of the prior art, FIG. 6 shows a waveform chart of the output waveform of the prior-art delay circuit device shown in FIG. 4.

Input clock signal 1201 is a fixed-cycle high-level pulse that uses a rising edge. Clock signal group 1202 is the output of all inverters within delay circuit bank 1101, and represents the clock signal advancing through delay circuit bank 1101. Clock signal 1203 is the output of reception circuit 1105 and represents the clock signal inputted to control terminal 1109. Clock signal group 1204 is the output of all inverters within delay circuit bank 1102 and represents the clock signals advancing through delay circuit bank 1102. Clock signal 1205 represents the output of amplification circuit 1106.

Clock signals are inputted cyclically, and in actual use, individual signals are not distinguished. However, in the interest of simplifying the explanation of operation, a single particular clock signal pulse will here be identified as the "(m)th clock signal," the next clock signal pulse will be identified as the "(m+1)th clock signal," and the next clock signal pulse will be identified as the "(m+2)th clock signal."

The (m)th clock signal, after passing through external signal reception circuit 1105, passes through delay circuit 1107 having a delay time equivalent to that of reception circuit 1105 and through delay circuit 1108 having a delay time equivalent to that of amplification circuit 1106 to enter delay circuit bank 1101, and proceeds through delay circuit bank 1101, indicated by the (m)th clock signal group within clock signal group 1202. The inverter output within delay circuit bank 1101 becomes high level due to the advance of the (m)th clock signal, and maintains high-level output during the interval of the pulse width of the (m)th clock signal. The (m+1)th clock signal is inputted from reception circuit 1105 to control terminal 1109 one clock signal cycle after the (m)th clock signal leaves reception circuit 1105 and is represented by the (m+1)th clock signal of clock signal 1203. At this time, the (m)th clock signal is advancing through delay circuit bank 1101. For example, if advances from w the (j)th inverter FIj within delay circuit bank 1101 to the (j-k)th inverter FIj-k during the width of the (m)th clock signal, the output from the (j)th inverter FIj to the (j-k)th inverter FIj-k is high level, as explained hereinabove. Accordingly, both inputs of NAND circuits CNj to CNj-k of control circuit 1103 that are connected to the output of inverters FIj to FIj-k during the progression of the (m)th clock signal are high level and their output is low level.

As a result, both inputs of the NAND circuit inputs within delay circuit bank 1102 are queued at high level. Of these, one of the two inputs of each of NAND circuits RNj to RNj-k within delay circuit bank 1102 connected to NAND circuits CNj to CNj-k of control circuit 1103 becomes low level, the output switches from high level to low level, the (m)th clock signal becomes a low-level pulse and proceeds through delay circuit bank 1102, and is represented by the (m)th clock signal group within clock signal group 1204. Of the two inputs of NAND circuits FNj+2 to FNj-k+2 within delay circuit bank 1101, the inputs that are connected to NAND circuits CNj to CNj-k of control circuit 1103 become low level, and as a result, the outputs of inverters FIj+2 to FIj-k+2 all become low level, and the (m)th clock signal within delay circuit bank 1101 is reset. The (m)th clock signal that exits delay circuit bank 1102 is outputted by way of amplification circuit 1106, and is indicated by the (m)th clock signal of clock signal 1204.

Explanation will next be presented regarding delay times. As explained hereinabove, the delay times of reception circuit 1105 and delay circuit 1107 are equal to d1. Also as explained hereinabove, the delay times of amplification circuit 1106 and delay circuit 1108 are each equal to d2. The cycle of clock signal is tCK. The delay between the rising edge of the (m)th clock signal of input clock signal 1201 and the rising edge of the (m)th clock signal of clock signal 1203 outputted from the reception circuit 1105 is d1. The delay between the (m)th clock signal of clock signal 1203 outputted from reception circuit 1105 and the rising edge of the leading clock signal of the (m)th clock signal group of clock signal group 1202 advancing through delay circuit bank 1101 is equal to the delay between the (m)th clock signal of clock signal 1203 outputted from the reception circuit 1105 and the rising edge of the (m+1)th clock signal of clock signal 1203 outputted from the reception circuit 1105, this delay being tCK. Accordingly, the time for the rising edge of the clock signal to proceed through delay circuit bank 1101 is the time interval tCK−d1−d2, or the clock signal cycle tCK less the delay times d1 and d2 of delay circuits 1107 and 1108.

The delay circuits of delay circuit bank 1102 through which the rising edge of the low-level pulse of a clock signal advances have the same number of constituent sections as the delay circuits of delay circuit bank 1101 through which the rising edge of a clock signal advances, and as a result, the time for the rising edge of a low-level pulse of a clock signal to proceed through delay circuit bank 1102 is equal to the time for the rising edge of a clock signal to proceed through delay circuit bank 1101, this value being tCK d1−d2, or the cycle of the clock signal tCK less the delay times d1 and d2 of delay circuit 1107 and 1108. As described hereinabove, the time necessary for a clock signal to pass through amplification circuit 1106 is d2. The time necessary for a clock signal to pass through reception circuit 1105, delay circuit 1107, delay circuit 1108, delay circuit bank 1101, delay circuit bank 1102, and amplification circuit 1106 is 2tCK; and the (m)th clock signal is therefore outputted to the internal circuit at the same timing as the (m+2)th clock signal.

In this example of a delay circuit device of the prior art, the delay times of delay circuit bank 1101 and delay circuit bank 1102 have been made equal, and therefore, for example, the mask patterns of NAND circuit FNn, inverter FIn, and NAND circuit CNn and the mask layouts of NAND circuit RNn, inverter RIn, and NAND circuit GNn are made mirror-image patterns and the load is equal. In addition, the power supplied this circuit may be fed from a constant-voltage supply circuit mounted on the semiconductor circuit device, and therefore, the delay times of the delay circuits do not depend on the voltage of an external power source. Moreover, by regulating the voltage supplied from the constant-voltage supply circuit, the number of gate sections used in delay circuit bank 1101 and delay circuit bank 1102 can be adjusted.

Through the use of this example of a delay circuit device of the prior art, an internal clock signal having no delay differential with the external clock signal can be obtained after a minimum of two clock signals, although the delay time differential between an external clock signal and internal clock signal is somewhat dependent on the external clock signal cycle.

In this example of a delay circuit device of the prior art, delay circuit bank 1101 and delay circuit bank 1102 are digital circuits made up of inverters and NAND circuits and the delay times of these circuits have digital values. As a result, the delay time differential of the external clock signal (the (m+2)th clock signal) and internal clock signal the output from amplification circuit 1106 of the (m)th clock signal is dependent on the cycle of the external clock signal.

Explanation will next be presented regarding this dependence of the delay time differential of the external clock signal (the (m+2)th clock signal) and the internal clock signal (the output from amplification circuit 1106 of the (m)th clock signal) on the cycles of the external clock signal.

As described in the foregoing explanation of operation, if the clock signal cycle is such that "the (m+1)th clock signal is inputted to control terminal 1109" during "the time interval that the (m)th clock signal pulse advances from the (j)th inverter FIj to the (j-k)th inverter FIj-k," the (m)th clock signal pulse "is transmitted to NAND circuits RN j to RNj-k within delay circuit bank 1102 and proceeds through delay circuit 1102," and therefore, the clock signal cycle transmitted to NAND circuits RNj to RNj-k within delay circuit bank 1102 has the width of the time interval tdF during which the (m)th clock signal advances from NAND circuit FNj to NAND circuit FNj+1. On the other hand, the delay time of the pulse advancing through delay circuit bank 1102 from NAND circuits RNj to RNj-k is fixed. As a result, when the output of first synchronous delay circuit 1100 is outputted by way of amplification circuit 1106, the dependence of the delay time differential between the amplification circuit 1106 output of the (m)th clock signal pulse and the (m+2)th external clock signal pulse upon the external clock signal cycle exhibits the sawtooth characteristic shown in FIG. 7 having a cycle which is the time to proceed from NAND circuit FNj to NAND circuit FNj+1 within delay circuit bank 1101 and having an amplitude which is the time tdB to proceed from NAND circuit RNj to NAND circuit RNj+1.

Thus, the sawtooth characteristic exhibited by the dependence of the delay time differential between the external clock signal and internal clock signal upon the cycle of the external clock signal shows a resolution corresponding to the delay times of the basic gate sections that constitute the delay circuits.

SUMMARY OF THE INVENTION

The object of the present invention is to provide a multiplex synchronous delay circuit that can improve the time of resolution resulting from the above-described dependence upon the external clock signal cycle.

To achieve the above-described objects, a multiplex synchronous delay circuit according to the present invention comprises: a plurality of synchronous delay circuits that each output delay signals having a delay time corresponding to pulse separation immediately preceding input of pulse signals, that maintain equal delay time differentials, and that output in order; and a multiplex circuit that inputs each of the delay signals, multiplexes the signals according to their logic output, and outputs the result as multiplex delay signals.

A multiplex synchronous delay circuit according to the present invention enables reduction of the dependence of the delay time differential between a delay signal and the external clock signal upon the external clock cycle by: providing a plurality of synchronous delay circuits; arranging a delay time differential that is smaller than the delay time of each gate section of the delay circuit banks making up the synchronous delay circuits at the input/output portion of the signal path of the synchronous delay circuits; and by multiplexing the output of the synchronous delay circuits by means of logic output.

According to an embodiment of the present invention, each synchronous delay circuit is provided with: an input delay adjustment circuit that inputs a signal corresponding to a pulse signal and equally adjusts each of the delay time differentials; a first delay circuit bank made up of a plurality of gate sections in cascade connection that inputs and sequentially delays the output of the input delay adjustment circuit and parallel outputs the output of each gate section in the order of the gate sections starting from the input side; a control circuit that parallel inputs the output of each gate section of the first delay circuit bank, synchronizes this output with the pulse signal, and parallel outputs each result; a second delay circuit bank made up of a plurality of gate sections in cascade connection arranged in the reverse direction of the signal transmission path of the first delay circuit bank that parallel inputs to each gate section each output of the control circuit in the order of the gate sections from the output side, sequentially delays these inputs, and outputs the result; and an output delay adjustment circuit that inputs the output of the second delay circuit bank, equally adjusts each of the delay time differentials, and outputs the result as the delay signals.

According to another embodiment of the present invention, the second delay circuit bank is provided with m rows of delay circuit sub-banks each made up of a plurality of gate sections in cascade connection arranged in the reverse direction of the signal transmission path of the first delay circuit bank; and the (d)th delay circuit sub-bank of these m rows of delay circuit sub-banks sincludes means for parallel inputting to every (n)th gate section from the output side the output of every (m)th gate section from the (d)th gate section of the control circuit, sequentially delays these inputs, and outputs the result; means for maintaining equal delay time differentials with respect to the output of each of these m rows of delay circuit sub-banks and sequentially outputting the result; and means for multiplexing by means of logic output of these outputs and outputting the result as the delay signals.

According to another embodiment of the present invention, the second delay circuit bank is provided with: m sub-output delay adjustment circuits that input each output of each of the m rows of delay circuit sub-banks, equally adjust each of the sub-delay time differentials, and output the result; and a sub-multiplex circuit that inputs the outputs of the m sub-output delay adjustment circuits, multiplexes the outputs by means of their logic output, and outputs the result as the delay signals.

According to another embodiment of the present invention, each synchronous delay circuit is provided with: an input delay adjustment circuit that inputs a signal corresponding to the pulse signal and equally adjusts each of the delay time differentials; a first delay circuit bank made up of a plurality of gate sections in cascade connection and loop connection that inputs and sequentially delays output of the input delay adjustment circuit and parallel outputs the output of each of the gate sections in the order of the. gate sections from the input side; a control circuit that parallel inputs the output of each gate section of the first delay circuit bank, synchronizes with the pulse signal, and parallel outputs each result; a second delay circuit bank made up of a plurality of gate sections in cascade connection and loop connection arranged in the reverse direction of the signal transmission path of the first delay circuit bank that parallel inputs to each gate section each output of the control circuit in the order of the gate sections from, the output side, sequentially delays these inputs, and, outputs the result; counting means that adds each time a signal corresponding to the pulse signal makes a circuit of the loop within the first delay circuit bank, subtracts each time a signal makes a circuit of the loop in the second delay circuit bank, and outputs a signal indicating that the number of circuits completed in the first and second delay circuit banks are equal; a selector circuit that, in accordance with output of the counting means, extracts from output a signal corresponding to the pulse signal circulating within the second delay circuit bank; and an output delay adjustment circuit that inputs output of the selector circuit, equally adjusts each of the delay M time differentials, and outputs the result as the delay signals.

According to another embodiment of the present invention, the count means is provided with an adder that adds each time a signal corresponding to the pulse signal makes a circuit of the loop within the first delay circuit bank; a transmitter that parallel inputs output of the adder, synchronizes with the pulse signal, and parallel outputs each output; and a subtracter that parallel inputs output of the transmitter, and subtracts each time the signal corresponding to the pulse signal makes a circuit of the loop within the second delay circuit bank.

According to another embodiment of the present invention, each synchronous delay circuit is provided with: an input delay adjustment circuit that inputs a signal corresponding to the pulse signal and equally adjusts each of the delay time differentials; a first delay circuit bank made up of a plurality of gate sections in cascade connection that inputs and sequentially delays output of the input delay adjustment circuit and parallel outputs the output of each of the gate sections in the order of the gate sections from the input side; a latch circuit that parallel inputs output of each gate section of the first delay circuit bank, synchronizes with the pulse signal, and latches and parallel outputs each result; a second delay circuit bank made up of a plurality of gate sections in cascade connection arranged in the same direction as the signal transmission path of the first delay circuit bank that inputs and sequentially delays the pulse signal and parallel outputs the output of each gate section in the order of the gate sections from the input side; a control circuit that parallel inputs the output of each gate section of the second delay circuit bank, controls each input in accordance with each parallel output of the latch circuit, and wired OR outputs the result; and an output delay adjustment circuit that inputs the output of the control circuit, equally adjusts each of the delay time differentials, and outputs the result as the delay signals.

The above and other objects, features, and advantages of the present invention will become apparent from the following description with references to the accompanying drawings which illustrate examples of the present invention.

BRIEF DESCRIPTION OF THE DRAWINGS

FIGS. 13, 13A and 13B show a block diagram showing another example of the configuration of the first embodiment of the multiplex synchronous delay circuit;

FIGS. 15, 15A and 15B show a block diagram showing the second embodiment of the multiplex synchronous delay circuit of the present invention;

FIGS. 19, 19A and 19B show a block diagram showing another example of the configuration of second embodiment of a multiplex synchronous delay circuit;

FIGS. 20, 20A and 20B show a block diagram showing the third embodiment of the multiplex synchronous delay circuit of the present invention;

DETAILED DESCRIPTION OF THE PREFERRED EMBODIMENTS

Figure 8:
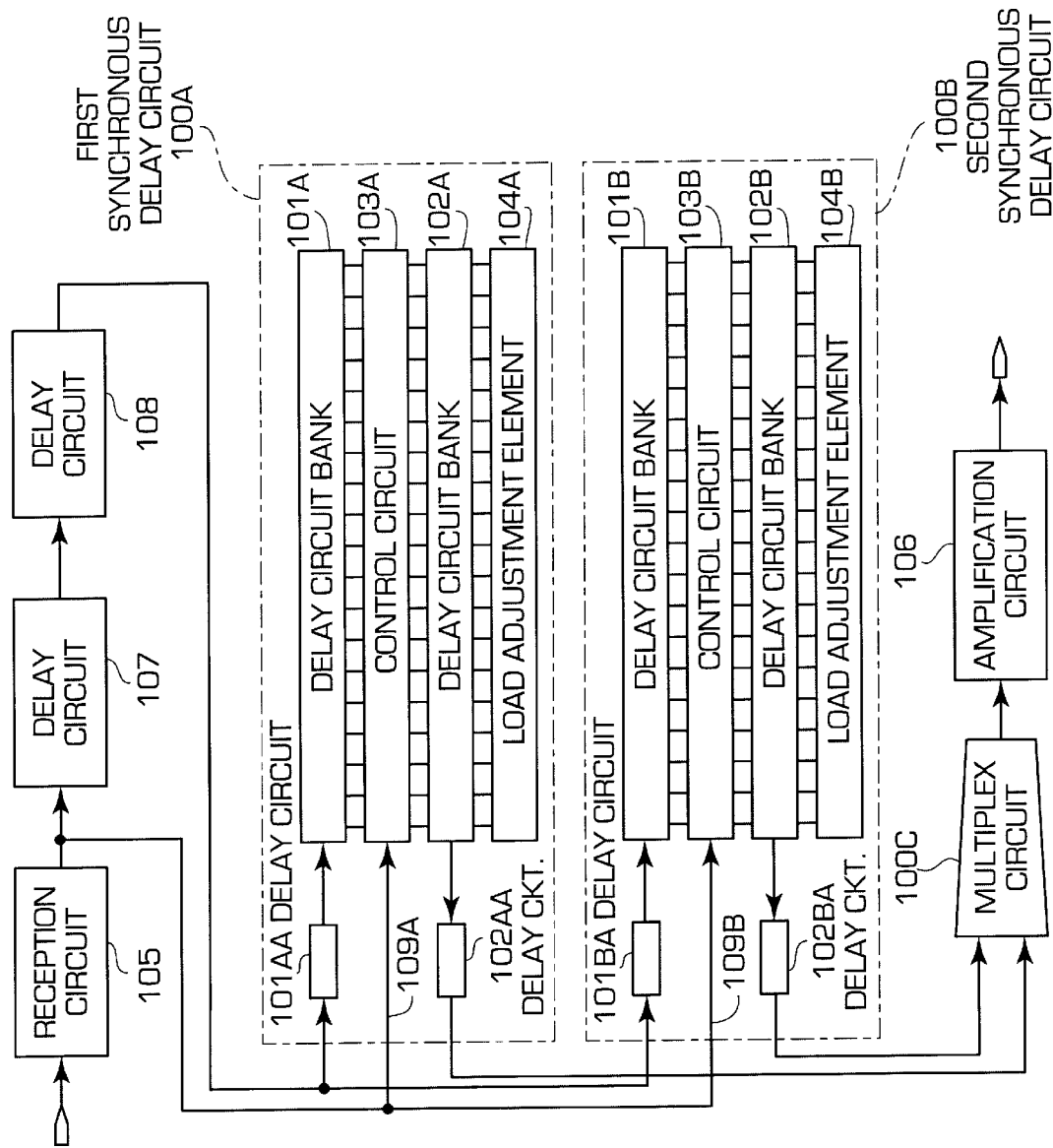
FIG. 8 is a block diagram showing the first embodiment of the multiplex synchronous delay circuit of the present invention.

Referring to FIG. 8, the multiplex delay circuit according to the first embodiment of the present invention is made up of: reception circuit 105; delay circuits 107 and 108; amplification circuit 106; first and second synchronous delay circuits 100A and 100B that, while maintaining equal delay time differentials, successively output delay signals having a delay time corresponding to the pulse spacing immediately preceding input of the pulse signal; and multiplex circuit 100C that inputs each delay signal, multiplexes according to logic output of the delay signals, and outputs the result as multiplexed delay signals.

Reception circuit 105 has a pulse-width generating function for generating pulses tPW in width from input signals. Delay circuits 107 and 108 have a delay time sum equal to the sum of the delay times of reception circuit 105 and amplification circuit 106 less the time of the pulse width tPW. The output of reception circuit 105 is connected to delay circuit 107 and to control terminals 109A and 109B of each of synchronous delay circuits 100A and 100B. The output of delay circuit 107 is connected to the input of delay circuit 108. The output of delay circuit 108 is connected to the input of delay circuit 101AA within first synchronous delay circuit 100A and to the input of delay circuit 101BA within second synchronous delay circuit 100B. The input of amplification circuit 106 is connected to the output of multiplex circuit 100C and outputs amplified multiplexed delay signals.

Figure 9:
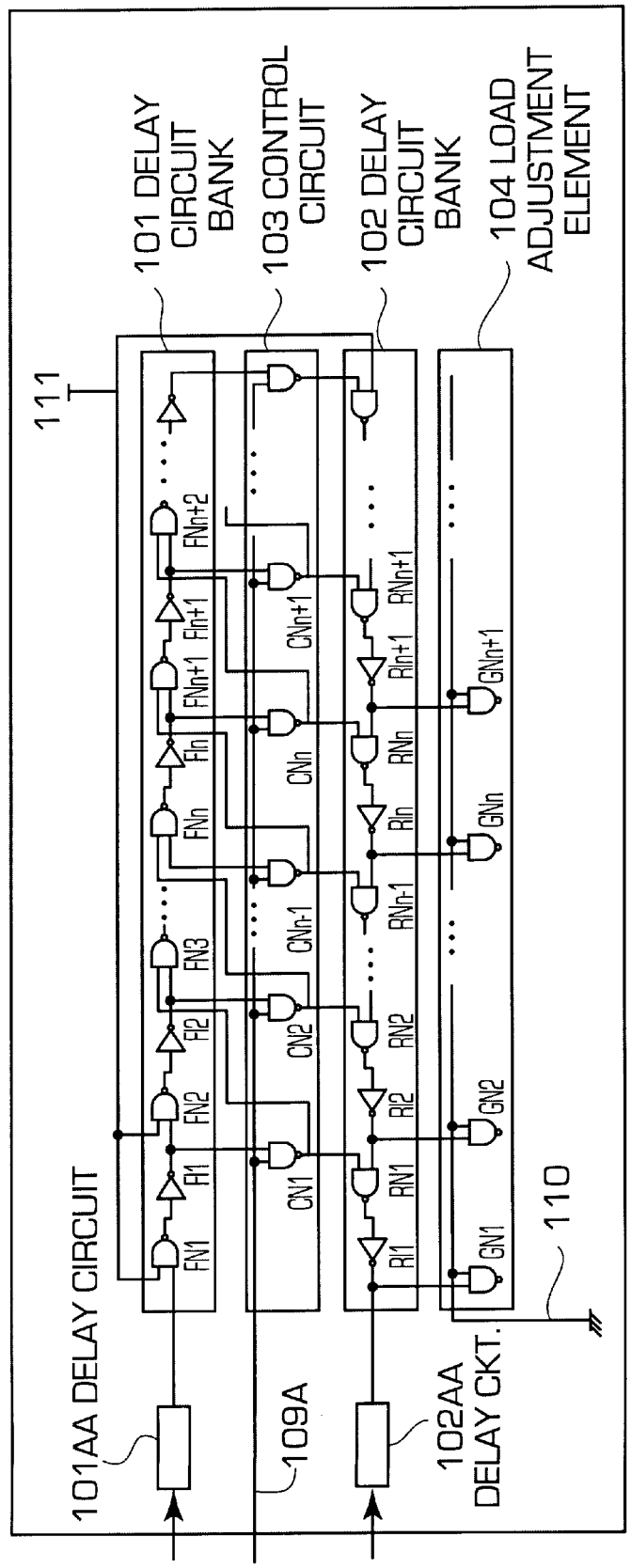
FIG. 9 a circuit diagram showing an example of the internal configuration of first synchronous delay circuit 100A in FIG. 8.

Referring to FIG. 9, first synchronous delay circuit 100A is made up of: delay circuit 101AA, which is an input delay adjustment circuit that inputs signals corresponding to the pulse signal and equally adjusts each delay time differential; first delay circuit bank 101A made up of a plurality of gate sections in cascade connection that inputs and sequentially delays the output of delay circuit 101AA and that parallel outputs the output of each gate section in the order of the gate sections from the input side; control circuit 103A that parallel inputs the output of each gate section of this first delay circuit bank 101A, synchronizes with the pulse signal, and parallel outputs each [result]; second delay circuit bank 102A made up of a plurality of gate sections in cascade connection arranged in a line in the reverse direction of the signal transmission path of first delay circuit bank 101A that parallel inputs to each of the gate sections the respective output of control circuit 103A in the order of the gate sections from the output side, sequentially delays these inputs, and outputs the results; delay circuit 102AA, which is an output delay adjustment circuit that inputs the outputs of the second delay circuit bank 102A, equally adjusts each delay time differential, and outputs the result as the delay signals; and a load adjustment element 104A. The second synchronous delay circuit 100B has an equivalent construction.

A more detailed explanation will next be presented regarding the internal construction, operation, delay times, and dependence on the external clock signal cycle of each of these synchronous delay circuits. Here, first synchronous delay circuit 100A and second synchronous delay circuit 100B are equivalent in terms of construction and operation, and explanation is therefore limited to first synchronous delay circuit 100A. First, the internal construction of each block within first synchronous delay circuit 100A will be explained in detail with reference to FIG. 9.

Delay circuit bank 101A and delay circuit bank 102A are each made up of alternately arranged inverters and NAND circuits. Control circuit 103A and load adjustment element 104A are made up of NAND circuits. Delay circuit bank 101A is constituted by a construction in which NAND circuits and inverters are connected from the input side in the order: NAND circuit FN1, inverter FI1, NAND circuit FN2, inverter FI2, ... , NAND circuit FNn, inverter FIn, NAND circuit FNn+1, inverter FIn+1, and so on. Delay circuit bank 102A is made up of a construction in which NAND circuits and inverters are connected from the output side in the order: inverter RI1, NAND circuit RN1, inverter RI2, NAND circuit RN2, ... , inverter RIn, NAND circuit RNn, inverter RIn+1, NAND circuit RNn+1, and so on. Control circuit 103A is composed of a NAND circuit bank in the order: NAND circuit CN1, NAND circuit CN2, ... , NAND circuit CNn, NAND circuit CNn+1, and so on, each NAND circuit having one input terminal connected to control terminal 109A. Load adjustment element 104A is made up of a NAND circuit bank in the order: NAND circuit GN1, NAND circuit GN2, ... , NAND circuit GNn, NAND circuit GNn+1, and so on, each NAND circuit having one input terminal connected to ground line 110.

Explanation will next be given regarding the interconnections at the (n)th gate section of each of delay circuit bank 101A, delay circuit bank 102A, control circuit 103A, and load adjustment element 104A within first-synchronous delay circuit 100A.

The output of inverter FIn of delay circuit bank 101A is connected both to the input of NAND circuit FNn+1, and to the input terminal of the two input terminals of NAND circuit CNn of control circuit 103A that is not connected to control terminal 109A. The output of NAND circuit CNn of control circuit 103A is connected to the input terminal of the two input terminals of NAND circuit FNn+2 of delay circuit bank 101A that is not connected to the output of inverter FIn+1 and to the input terminal of the two input terminals of NAND circuit RNn of delay circuit bank 102A that is not connected to the output of inverter RIn+1. The output of NAND circuit RNn of delay circuit bank 102A is connected to the input of inverter RIn of delay circuit bank 102A.

The output of inverter RIn of delay circuit bank 102A is inputted to NAND circuit RNn−1 and is connected to the input terminal of the two input terminals of NAND circuit GNn of load adjustment element 104A that is not connected to ground line 110A. The output of NAND circuit GNn of load adjustment element 104A is not connected to any component. In addition, each of three input terminals, i.e., the input terminal of the two input terminals of NAND circuit FN1 of delay circuit bank 101A that is not connected to the input terminal of delay circuit bank 101A, the input terminal of the two input terminals of NAND circuit FN2 that is not connected to the output of inverter FI1, and the input terminal of the two input terminals of the last NAND circuit of delay circuit bank 102A that is not connected to the output of the last NAND circuit of control circuit 103A, are connected to power source line 11A.

Figure 10:
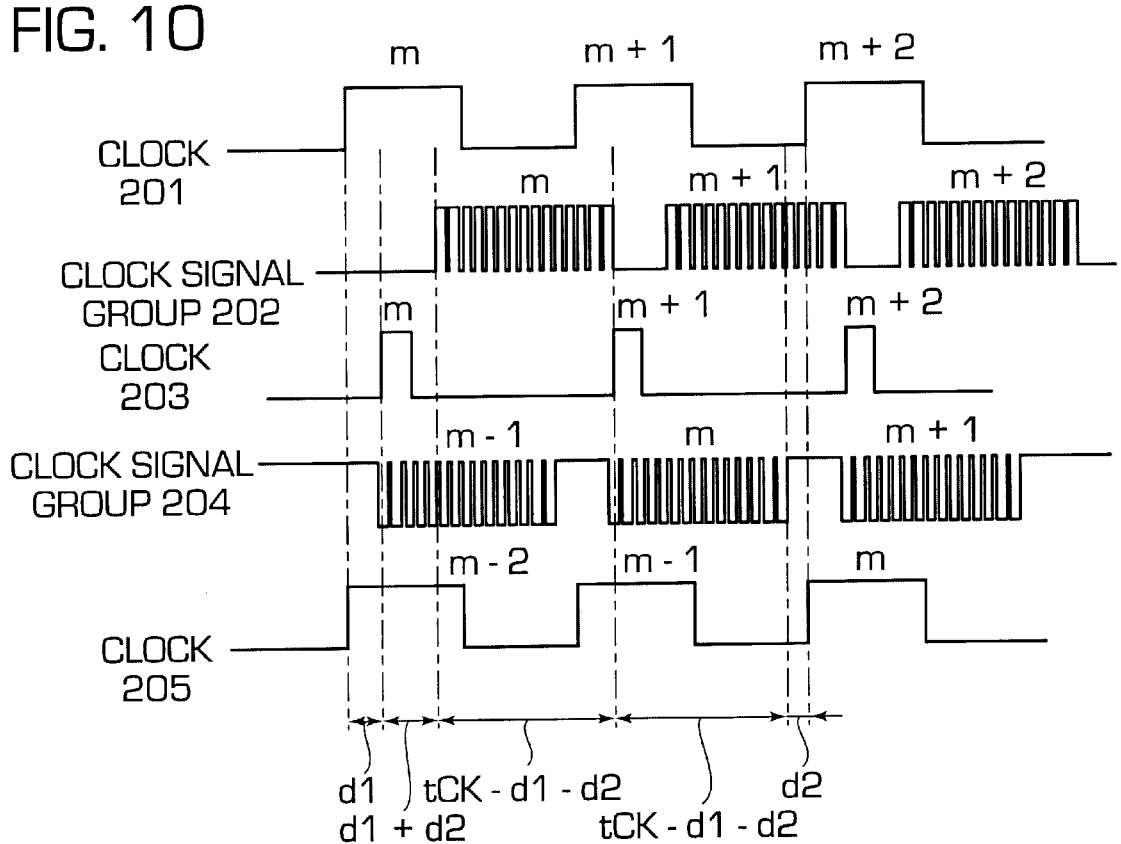
FIG. 10 is a waveform chart for illustrating the internal operation of the multiplex synchronous delay circuit of FIG. 8.

Details of the operation of this first synchronous delay circuit 100A will next be described with reference to FIG. 10. Input clock signal 201 is a fixed-cycle high-level pulse that uses the rising edge. Clock signal pulse group 202 represents the output waveform of all inverters within delay circuit bank 101A. Clock signal pulse 203 is the output waveform of reception circuit 105, and represents the clock signal pulse inputted to control terminal 109A. Clock signal pulse group 204 represents the output waveform of all inverters within delay circuit bank 102A. Clock signal pulse 205 represents the output of amplification circuit 106. The clock signal pulses are inputted cyclically and therefore are not individually distinguished in actual use, but in the interest of clarifying the explanation of operation, one arbitrary clock signal pulse is here identified as the (m)th clock signal, the succeeding clock signal pulse is identified as the (m+1)th clock signal pulse, and the next clock signal pulse is identified as the (m+2)th clock signal pulse.

After input to reception circuit 105 for external signals, the (m)th clock signal pulse passes through delay circuit 107, delay circuit 108, and delay circuit 101AA, enters delay circuit bank 101A, and proceeds through delay circuit bank 101A. The (m)th clock signal pulse as it advances through delay circuit bank 101A is represented by the (m)th clock signal pulse group of clock signal pulse group 202. The inverter output within delay circuit bank 101A becomes high level due to the progress of the (m)th clock signal pulse and maintains the high-level output for the duration of the pulse width of the (m)th clock signal pulse. One clock cycle after the (m)th clock signal pulse exits reception circuit 105, the (m+1)th clock signal pulse is inputted from reception circuit 105 to control terminal 109A, and is represented by the (m+1)th clock signal pulse of clock signal 203. At this time, the (m)th clock signal pulse is proceeding through delay circuit bank 101A, and if the progression is, for example, from the (j)th inverter FIj to the (j-k)th inverter FIj-k within delay circuit bank 101A, the output of inverters FIj to FIj-k is high-level outputs as described hereinabove. Accordingly, both inputs of each of NAND circuits CNj to CNj-k of control circuit 103A, which are connected to the output of inverters FIj to FIj-k during the advance of the (m)th clock signal pulse, become high level, and their output becomes low level.

As a result, both inputs of the NAND circuit input within delay circuit bank 102A are queued at high level, but of these two inputs, the inputs of each NAND circuit RNj to RNj-k within delay circuit bank 102A that are connected to NAND circuits CNj to CNj-k of control circuit 103A become low level, whereby the output switches from high to low level, the (m)th clock signal pulse advances through delay circuit bank 102A as a low level pulse, and is represented by the (m)th clock signal pulse group within clock signal pulse group 204. In addition, of the two inputs of each of NAND circuits FNj+2 to FNj-k+2 within delay circuit bank 101A, the input that is connected to NAND circuits CNj to CNj-k of control circuit 103A becomes low level, whereby the outputs of inverters FIj+2 to FIj-k+2 all become low level, and the (m)th clock signal pulse within delay circuit bank 101A is reset. The (m)th clock signal pulse that exits delay circuit bank 102A inverts during its passage through delay circuit 102AA, multiplex circuit 100C, and amplification circuit 106 is outputted as a high-level pulse and is indicated by the (m)th clock signal of clock signal 205.

Explanation will next be presented regarding the delay times of this first synchronous delay circuit 100A.

The delay time of reception circuit 105 is d1. The delay time of amplification circuit 106 is d2. As explained hereinabove, delay circuit 107 and delay circuit 108 have a pulse width generating function for generating an input signal with a pulse width tPW, and have a delay time equal to the delay time of external signal reception circuit 105 plus the delay time of amplification circuit 106 less the pulse width tPW, and the sum of the delay time of delay circuit 107 and the delay time of delay circuit 108 is therefore d1+d2−tPW. The cycle of the clock signal is tCK. The delay between the rising edge of the (m)th clock signal pulse of input clock signal 201 and the rising edge of the (m)th clock signal pulse of output clock signal 203 of the reception circuit is d1. The delay between the (m)th clock signal pulse of output clock signal 203 of the reception circuit and the rising edge of the leading clock signal of the (m)th clock signal pulse group of clock signal pulse group 202 advancing through delay circuit bank 101A is tCK, which is equal to the delay between the (m)th clock signal pulse of output clock signal 203 of the reception circuit and the rising edge of the (m+1)th clock signal pulse of output clock signal 203 of the reception circuit.

Accordingly, the time interval of the advance of the rising edge of the clock signal through delay circuit bank 101A is the cycle of the clock signal tCK less the delay times of delay circuit 107 and delay circuit 108, or tCK−d1−d2+tPW. The delay circuits through which the rising edge of the low-level pulse of clock signal proceeds in delay circuit bank 102A is of a structure having the same number of sections as the delay circuits through which the rising edge of the clock signal proceeds in delay circuit bank 101A; and as a result, the time interval for the progression of the rising edge of the low-level clock signal through delay circuit bank 102A is equal to the time interval for the progression of the rising edge of the clock signal through delay circuit bank 101A; this time interval being the cycle of the clock signal tCK less the delay times of delay circuit 107 and delay circuit 108, or tCK−d1−d2+tPW. The time required for passage through amplification circuit 106 is d2, as described hereinabove.

The time required for the passage of a clock signal through reception circuit 105, delay circuit 107, delay circuit 108, delay circuit bank 101A, delay circuit bank 102A, and amplification circuit 106 is 2tCK; and if the delay time tdF of NAND circuit FNm and inverter FIm and the delay time tdB of NAND circuit RNm and inverter RIm are ignored, the (m)th clock signal pulse is outputted to the internal circuit at the same timing as the (m+2)th clock signal pulse.

In addition, load is equalized in order to equalize the delay times of delay circuit bank 101A and delay circuit bank 102A by, for example, making the mask patterns of NAND circuit FNn, inverter FIn, and NAND circuit CNn the mirror image of the mask layouts of NAND circuit RNn, inverter RIn, and NAND circuit GNn. The power to the above-described circuit of this embodiment is supplied from a constant-voltage supply circuit mounted on a semiconductor circuit device on which the circuit of this embodiment is mounted. Accordingly, the delay times of the delay circuits of this embodiment are not dependent on the voltage of an external power supply; and the delay times of delay circuit bank 101A and delay circuit bank 102A can be adjusted by regulating the voltage supplied from a constant-voltage supply circuit or the threshold voltage of a transistor, thereby enabling adjustment of the number of gate sections employed.

Detailed explanation will next be presented regarding the dependence of the delay time differential between the external clock signal (the (m+2)th clock signal pulse) and the internal clock signal (the output from amplification circuit 106 of the (m)th clock signal pulse) in first synchronous delay circuit 100A upon the cycle of the external clock signal.

Figure 11:
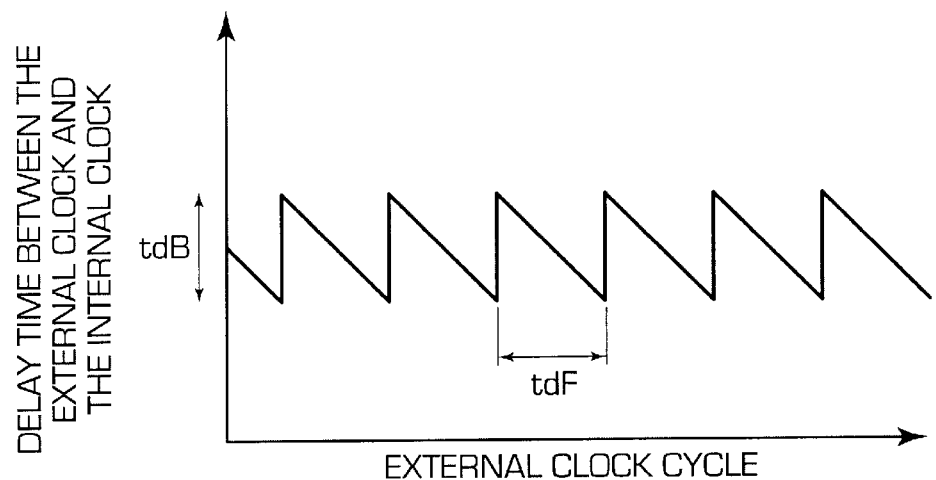
FIG. 11 is a characteristics chart showing the dependence of the delay time differential between the external clock and internal clock upon the external clock signal cycle in first synchronous delay circuit 100A of FIG. 9.

As explained in the foregoing description of the operation, during a clock signal cycle such that the (m+1)th clock signal is inputted to control terminal 109A in the time interval during which the (m)th clock signal pulse is in the (j)th inverter FIj to the (j-k)th inverter FIj-k, the (m)th clock signal pulse is transmitted to NAND circuits RNj to RNj-k within delay circuit bank 102A and advances through delay circuit bank 102A, and therefore, the clock signal cycle transmitted to NAND circuits RNj to RNj-k within delay circuit bank 102A has a width which is the time interval tdF, which is the time for the (m)th clock signal to proceed from NAND circuit FNj to NAND circuit FNj+1. On the other hand, the delay time of a pulse proceeding from NAND circuits RNj to RNj-k of delay circuit bank 102A is fixed. As a result, in a case in which the output of first synchronous delay circuit 100A is outputted by way of amplification circuit 106, the dependence of the delay time differential between the output of amplification circuit 106 of the (m)th clock signal pulse and the (m+2)th external clock signal pulse upon the external clock signal cycle exhibits a sawtooth waveform as shown in FIG. 11 having a cycle which is the time of progression from NAND circuit FNj to NAND circuit FNj+1 within delay circuit bank 101A, and an amplitude which is the time of progression tdB from NAND circuit RNj to NAND circuit RNj+1.

Explanation will next be presented regarding the principles behind the feature of the multiplex synchronous delay circuit of the present invention, which is the reduction of the dependence of the delay time differential between the external clock signal and internal clock signal upon external clock signal cycle, with regard to the multiplex delay circuit of this embodiment.

In the multiplex synchronous delay circuit of this embodiment, as explained hereinabove, when the output of first synchronous delay circuit 100A or second synchronous delay circuit 100B is outputted by way of amplification circuit 106, the delay time differential between the output of the (m)th clock signal pulse by amplification circuit 106 and the (m+2)th external clock signal pulse exhibits a dependence on the external clock signal cycle which has a sawtooth waveform.

Figure 12:
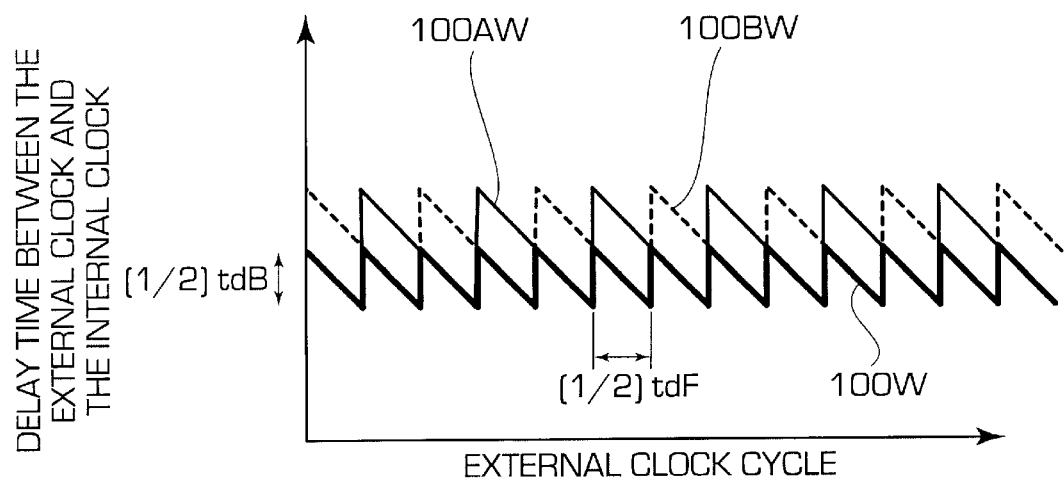
FIG. 12 is a characteristics chart showing the dependence of the delay time differential between the external clock and internal clock upon the external clock signal cycle in the multiplex synchronous delay circuit of FIG. 8.

As constituent elements that enable alteration of the dependence upon the external clock signal cycle in the present invention, the first synchronous delay circuit 100A is provided with delay circuits 101AA and 102AA and second synchronous delay circuit 100B is provided with delay circuits 101BA and 102BA, with delay time differentials existing between delay circuits 101AA, 102AA and delay circuits 101BA, 102BA. The delay time differential between delay circuit 101AA and delay circuit 101BA is equal to exactly one-half the above-described tdF, and the delay time differential between the delay circuit 102AA and delay circuit 102BA is equal to one-half the above-described tdB. As a result, each of the above-described sawtooth portions of the external clock cycle dependence has a timing that is shifted exactly "a time interval of one-half tdF" as shown in FIG. 12. In the present embodiment, the output of delay circuit 102AA and delay circuit 102BA having each of these timings is logic outputted and multiplexed by multiplex circuit 100C. For this reason, as can be seen from the multiplex circuit output 100W of FIG. 12, this allows a reduction of the dependence of the delay time of the internal clock signal output and the external clock signal pulse upon the external clock signal cycle.

Through the use of the multiplex synchronous delay circuit of the present embodiment, an internal clock signal having no delay differential with respect to the external clock signal can be reliably obtained after only two clock signals, and moreover, because the construction is entirely of digital circuits, dependence of the delay time of the output of a clock signal pulse from amplification circuit 106 and the external clock signal pulse upon the external clock signal cycle can be reduced to less than the delay time units of the digital circuits.

Although delay circuit bank 101, delay circuit bank 102, control circuit 103, and load adjustment element 104 of the present embodiment are constituted by NAND circuits and inverters, these components may be constituted by other elements.

Figures 13A, 13B:
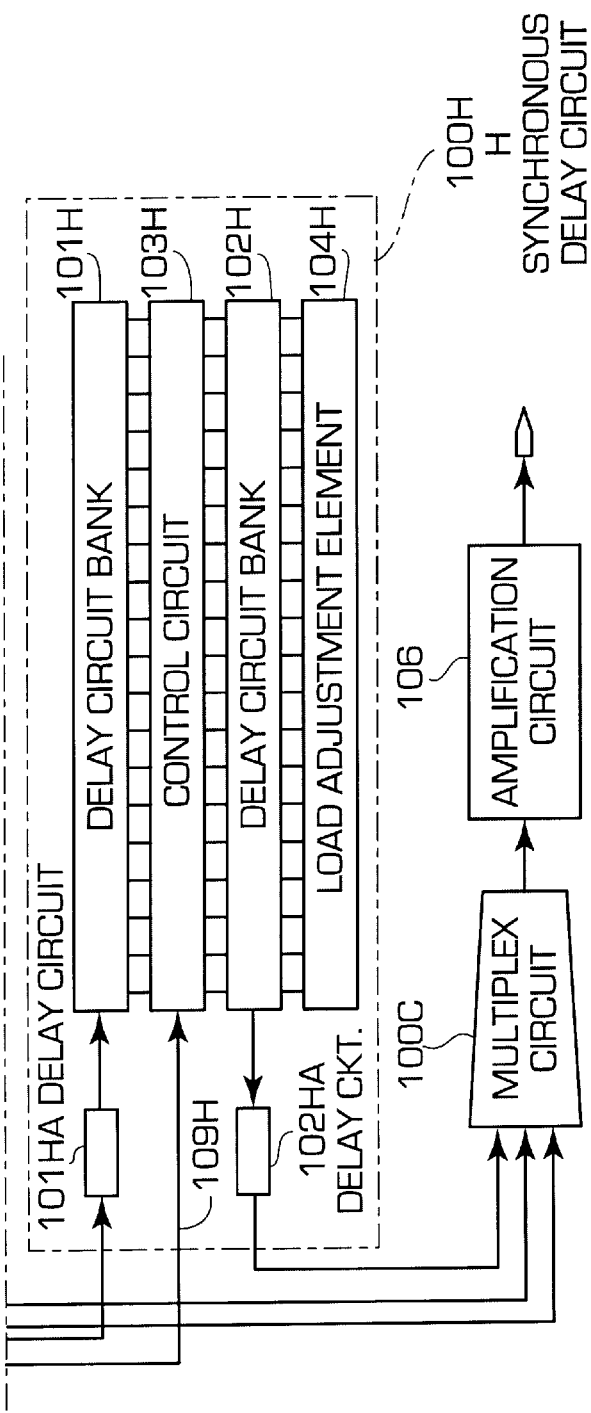
Figure 14:
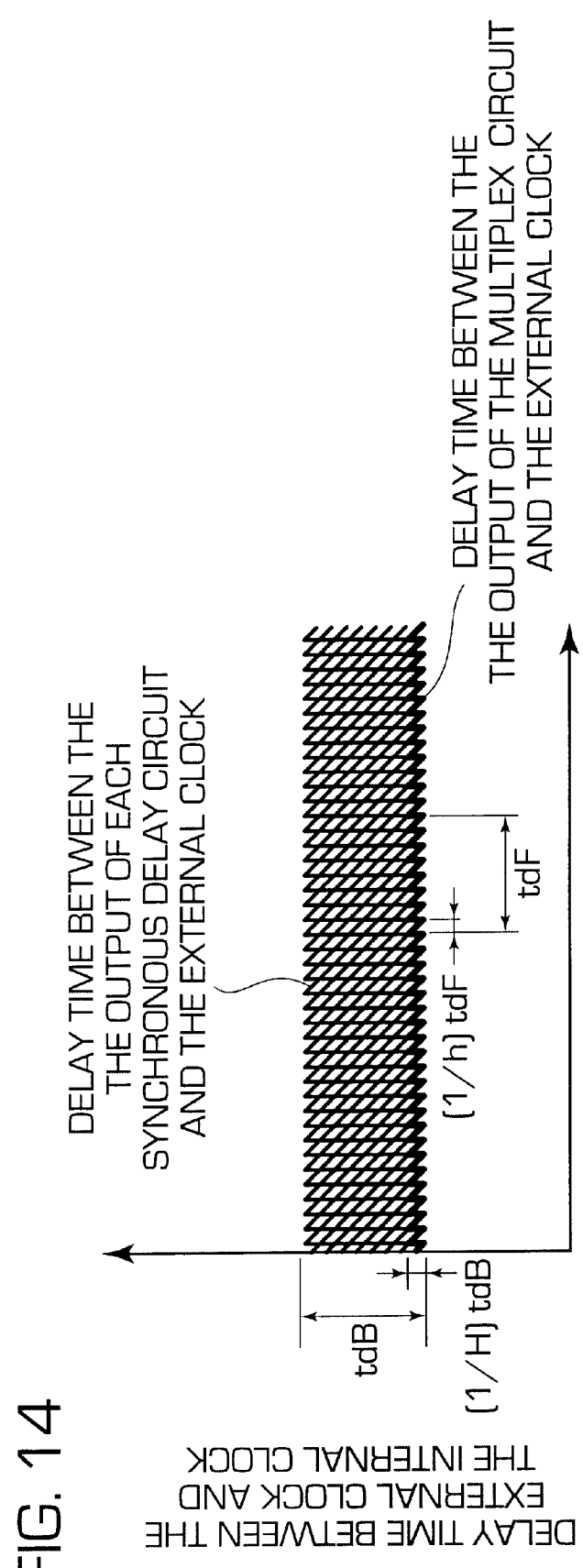
FIG. 14 is a characteristics chart showing the dependence of the delay time differential between the external clock and internal clock upon the external clock signal cycle in the multiplex synchronous delay circuit of FIG. 13.

Further, although the present embodiment is constructed of two sets of synchronous delay circuits, the dependence upon the external clock signal cycle may be further reduced as shown in FIG. 14 by increasing the number of synchronous delay circuit as shown in FIG. 13.

Figure 15B:
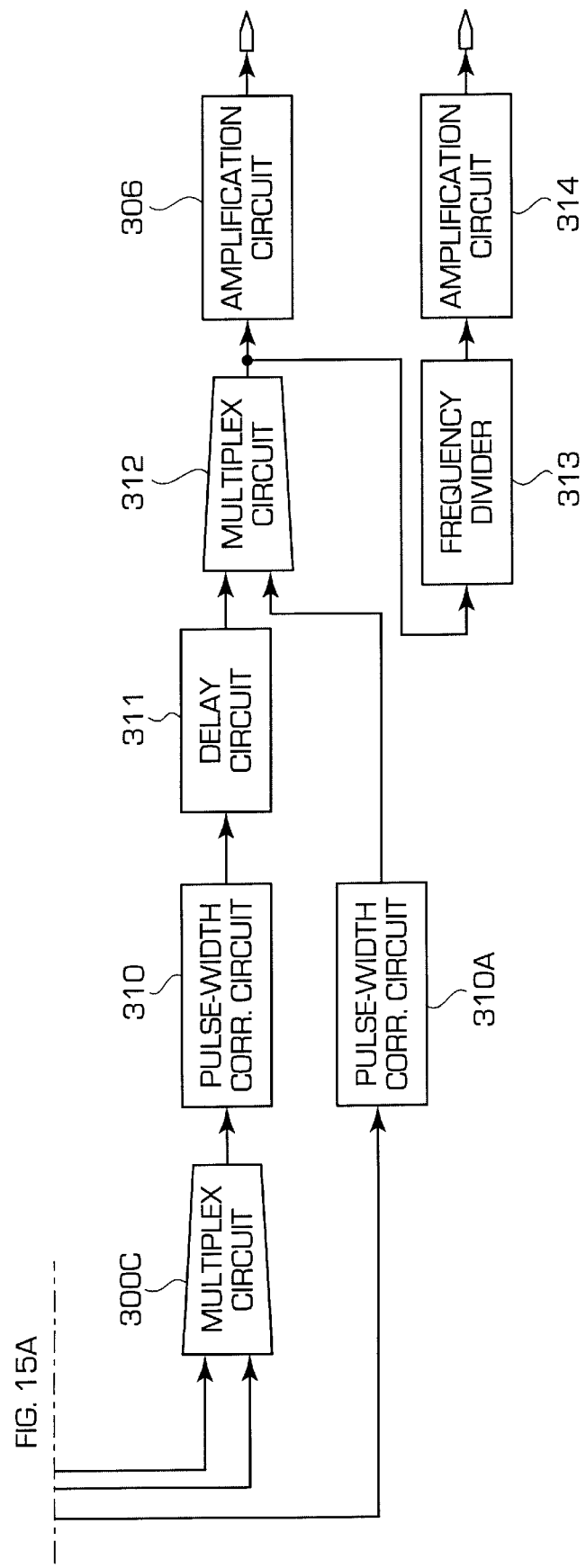

Referring to FIG. 15, a multiplex synchronous delay circuit according to a second embodiment of the present invention is of a construction in which pulse-width correction circuit 310, delay circuit 311, multiplex circuit 312, frequency divider 313, and amplification circuit 314 are added between multiplex circuit 100C and amplification circuit 106 of the multiplex synchronous delay circuit of the first embodiment shown in FIG. 8. In this construction, the output of multiplex circuit 300C is connected to amplification circuit 306 by way of pulse-width correction circuit 310, delay circuit 311, and multiplex circuit 312, and the output of multiplex circuit 312 is connected to amplification circuit 314 by way of frequency divider 313.

Figure 16:
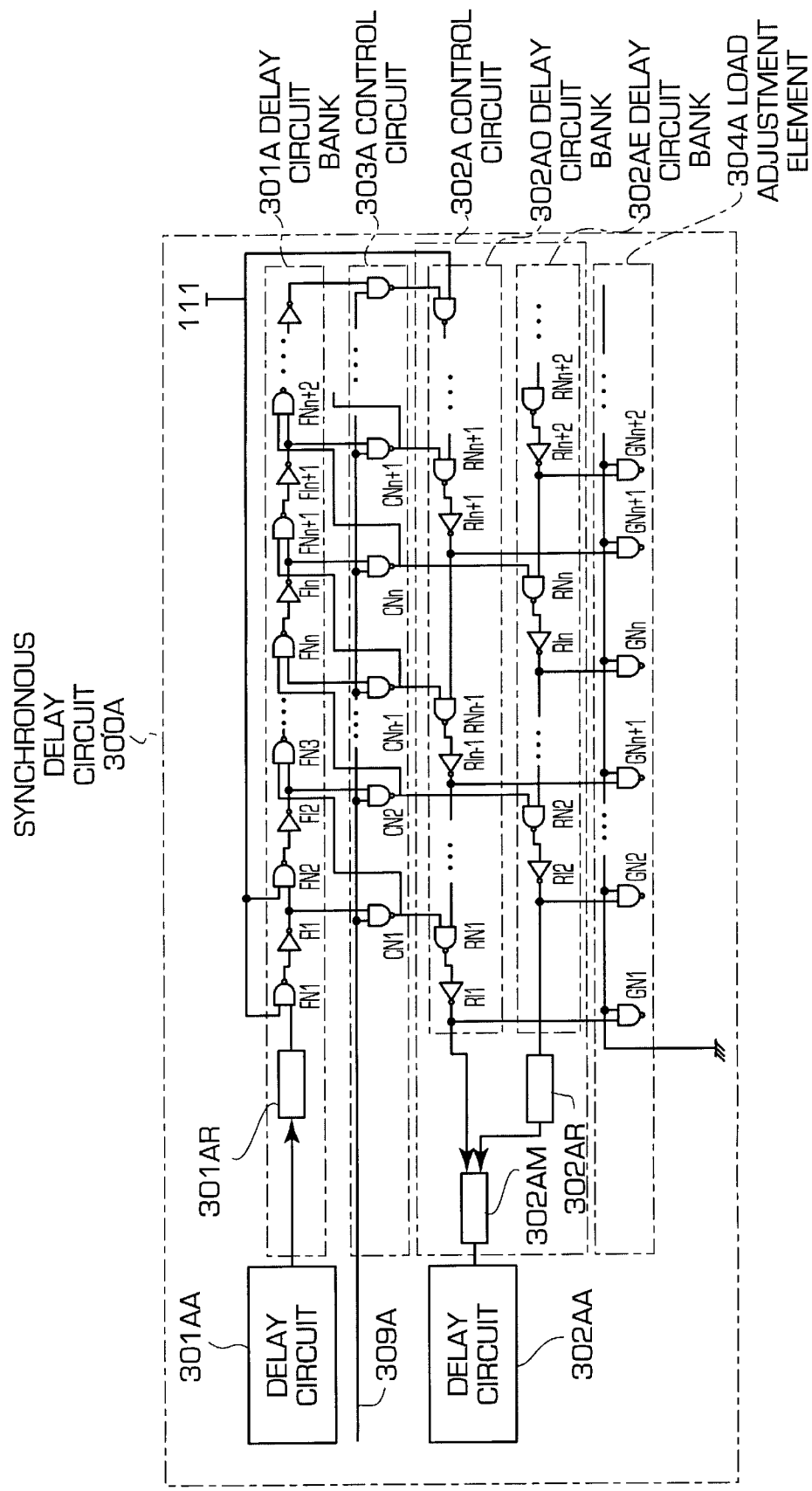
FIG. 16 is a circuit diagram showing an example of the internal configuration of first synchronous delay circuit 300A in FIG. 15.

The features of the multiplex synchronous delay circuit of this embodiment resides in each of synchronous delay circuits 300A and 300B, and since the construction and operation of each are equivalent, explanation will be given regarding only the first synchronous delay circuit 300A with reference to FIG. 16.

In each of the synchronous delay circuit of the present embodiment, delay circuit bank 301A is made up of a plurality of gate sections in cascade connection that is substantially equivalent to delay circuit bank 101A of the first embodiment, each section being made up of delay unit elements composed of a NAND circuit and an inverter, but a delay circuit 301AR for adjusting delay times is included in the input portion. Adjustment delay circuit 301AR has a delay time tdF that is equal to that of each NAND circuit FNm-and-inverter FIm section of delay circuit bank 301A.

Delay circuit bank 302A is made up of a plurality of gate sections in cascade connection equivalent to delay circuit bank 102A of the first embodiment, but as can be seen from the figure, this delay circuit bank 302A is composed of a combination of two parallel rows of delay circuit sub-banks having parallel input connections to odd-numbered sections and even-numbered sections, respectively, of the parallel outputs of delay circuit bank 301A by way of control circuit 303A. In other words, the outputs of odd-numbered gate sections of delay circuit bank 301A are connected to delay circuit sub-bank 302AO within delay circuit bank 302A by way of control circuit 303A, and the outputs of even-numbered gate sections of delay circuit bank 301A are connected to delay circuit sub-bank 302AE within delay circuit bank 302A by way of control circuit 303A.

The output of delay circuit sub-bank 302AO is inputted without change to multiplex circuit 302AM, and the output of delay circuit sub-bank 302AE is inputted to multiplex circuit 302AM by way of delay circuit 302AR, which is a sub-output delay adjustment circuit. Delay circuit 302AR has a delay time that is one-half the delay time tdB of each of the NAND circuit RNm-and-inverter RIm sections of delay circuit sub-banks 302AO and 302AE. The two rows of delay circuit sub-banks 302AO and 302AE within delay circuit bank 302A are each made up of half of the elements of delay circuit bank 301A, and the delay time is therefore one-half that of either delay circuit bank 301A or delay circuit bank 302A. In addition, the width of pulses transmitted from delay circuit bank 301A is also one-half that of delay circuit bank 301A or delay circuit bank 302A.

In each of the added blocks of this embodiment, delay circuit 311 has a delay time that is one-half the delay time of delay circuit 307 plus the delay time of delay circuit 308 (d1+d2), i.e., (d1+d2)/2, to which is added tPW/2, or one-half the time of the output pulse width tPW of reception circuit 105, for a delay time of (d1+d2)/2+tPW/2. As in the first embodiment, this embodiment uses the inverted output of delay circuit bank 302, and therefore, tPW/2, or one-half of the time of the pulse width tPW of the output of reception circuit 305, is added for timing correction. Pulse-width correction circuit 310A makes the pulse width tPW of the output of reception circuit 305 one-half the pulse width, or tPW/2. Multiplex circuit 312 combines the output of delay circuit 311 and the output of pulse-width correction circuit 310A. Frequency divider 313 frequency-divides the output of multiplex circuit 312 and outputs the result.

Figure 17:
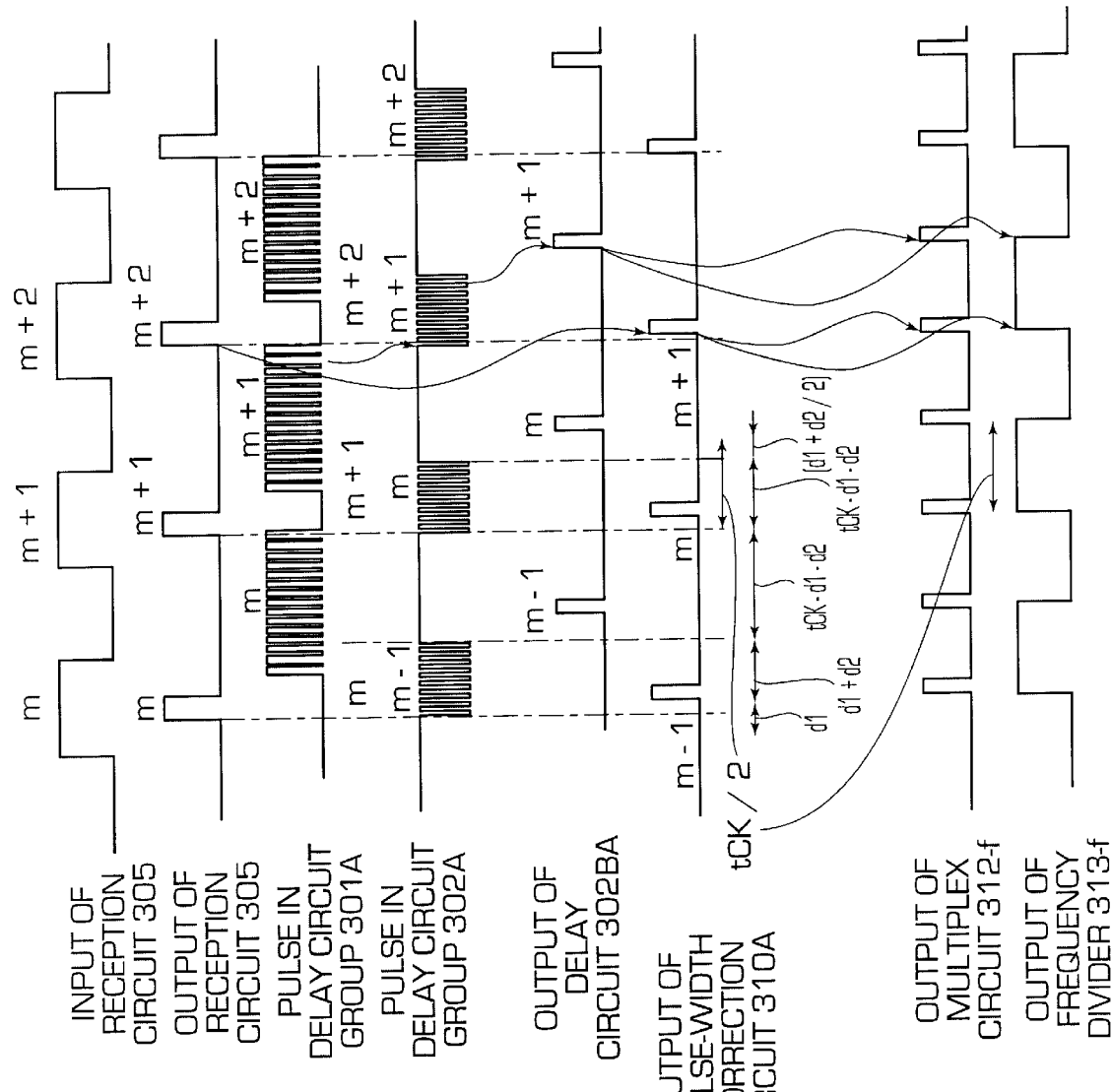
FIG. 17 is a waveform chart for illustrating the internal operation of the multiplex synchronous delay circuit of FIG. 15.

Explanation will next be given regarding the operation of each synchronous delay circuit of this embodiment with reference to FIG. 17, beginning with an explanation of the operation of delay circuit sub-bank 302AO of delay circuit bank 302A.

A high-level clock signal pulse inputted to reception circuit 305 is shaped to a pulse width of tPW at reception circuit 305 and outputted after a time interval of d1, passes through delay circuit 307 and delay circuit 308 in a time interval of d1 +d2, is inputted to delay circuit bank 301A by way of delay circuit 301AA and adjustment delay circuit 301AR, and continues to advance through delay circuit bank 301A until the time that the next clock signal pulse outputted from reception circuit 305 is inputted to control circuit 303A. The time of progression of the rising edge of this high-level clock signal pulse in delay circuit bank 301A is the clock signal cycle tCK less (d1+d2), or the time tCK−(d1+d2); and the progression time of the trailing edge is the clock signal cycle tCK less (d1+d2) and the pulse width tPW, or the time interval tCK−(d1+d2)−tPW. At the time the next clock signal pulse outputted from reception circuit 305 is inputted to control circuit 303A, the high-level clock signal pulse in delay circuit bank 301A is transmitted to delay circuit sub-bank 302AO and becomes a low-level clock signal pulse.

For example, in a case in which a clock signal pulse is transmitted to delay circuit sub-bank 302AO after having passed from adjustment delay circuit 301AR and advanced as far as the (2n−1)th odd-numbered gate section within delay circuit bank 301A, the number of gate sections of delay circuit sub-bank 302AO through which the pulse has passed is n. However, as described hereinabove, the delay time of adjustment delay circuit 301AR is equal to the delay time of each NAND circuit FNm-and-inverter FIm section within delay circuit bank 301A, and the delay time for the clock signal pulse to pass from adjustment delay circuit 301AR and advance as far as the (2n−1)th odd-numbered section gate within delay circuit bank 301A is therefore equal to the time of passage through 2n gate sections.

Accordingly, considered in terms of the number of gate sections, the time to pass through n gate sections of delay circuit sub-bank 302AO is exactly one-half the delay time for a clock signal pulse to pass through adjustment delay circuit 301AR and advance as far as the (2n−1)th odd-numbered gate section within delay circuit bank 301A, i.e., the time to pass through 2n gate sections.

Explanation will next be presented regarding the operation of delay circuit sub-bank 302AE of delay circuit bank 302A.

A high-level clock signal pulse inputted to reception circuit 305 is shaped to a pulse width of tPW at reception circuit 305, outputted after a time interval of d1, passes through delay circuit 307 and delay circuit 308 in a time interval of d1+d2, is inputted to delay circuit bank 301A by way of delay circuit 301AA and adjustment delay circuit 301AR, and continues to advance through delay circuit bank 301A until the next clock signal pulse outputted from reception circuit 305 is inputted to control circuit 303A. The time of progression of the rising edge of this high-level clock signal pulse through delay circuit bank 301A is the clock signal cycle tCK less (d1+d2), or the time interval tCK−(d1+d2); and the time of progression of the trailing edge is the clock signal cycle tCK less (d1+d2) and the pulse width tPW, or the time interval tCK−(d1+d2)−tPW. Upon input of the next clock signal pulse outputted from reception circuit 305 to control circuit 303A, the high-level clock signal pulse in delay circuit bank 301A is transmitted to delay circuit sub-bank 302AE of delay circuit bank 302A and becomes a low-level clock signal pulse.

For example, if the clock signal pulse is transferred to delay circuit sub-bank 302AE after having passed from adjustment delay circuit 301AR and advanced as far as the (2n)th even-numbered gate section within delay circuit bank 301A, the number of gate sections of delay circuit sub-bank 302AE through which the pulse has passed is n. However, as described hereinabove, the 8 delay time of adjustment delay circuit 301AR is equal to the delay time of each NAND circuit FNm-and-inverter FIm section of delay circuit bank 301A, and the delay time for a clock signal pulse to pass from adjustment delay circuit 301AR and advance as far as the (2n)th even-numbered gate section within delay circuit bank 301A is therefore equal to the time of passage through 2n+1 gate sections. Further, delay circuit 302AR, which is a sub-output delay adjustment circuit, has one-half the delay time of each NAND circuit FNm-and-inverter FIm section of delay circuit sub-banks 302AO and 302AE, and as a result, the delay time for passage-through n gate sections of delay circuit sub-bank 302AE as well as passage through delay circuit 302AR is equal to the time of passage through n+½ gate sections. Accordingly, considered in terms of the number of gate sections, the delay time for passage through n gate sections of delay circuit sub-bank 302AE as well as through adjustment delay circuit 302AR is exactly one-half the delay time for a clock signal pulse to pass from adjustment delay circuit 301AR and advance as far as the (2n)th even-numbered gate section within delay circuit bank 301A, i.e., the time to pass through 2n+1 gate sections.

As a result, the rising edge of a low-level clock signal pulse progressing through delay circuit sub-banks 302AO and 302AE advances for one-half of tCK−(d1+d2), i.e., the time to advance within delay circuit bank 301A. The trailing edge of low-level clock signal pulse progressing through delay circuit bank 302A advances for one-half of tCK−(d1+d2)−tPW, i.e., the time to progress through delay circuit bank 301A. The low-level pulse that exits delay circuit bank 302A is inverted within delay circuit 311 and becomes a high-level pulse. The delay time of delay circuit bank 302A is (d1+d2)/2+tPW/2. The time required from transfer to delay circuit bank 302AO and 302AE until output from delay circuit bank 302A is equal to the time {tCK−(d1+d2)−tPW}/2 to progress through delay circuit bank 301A as the trailing edge of a low-level clock signal pulse advancing through delay circuit bank 302A added to the time (d1+d2)/2+tPW/2 for inversion to high level within delay circuit 311 and advance, for a total of tCK/2.

Explanation will next be given regarding the dependence of the delay time differential between an external clock signal (the (m+2)th clock signal pulse) and an internal clock signal (the output from amplification circuit 306 of the (m)th clock signal pulse) upon the cycle of external clock signals in the synchronous delay circuit of the present embodiment.

First, in regard to the dependence of the delay time of delay circuit sub-bank 302AO upon the cycle of the external clock signal, in actual practice, the clock signal cycle employed in n gate sections of delay circuit sub-bank 302AO is generated when pulses are sent to delay circuit sub-bank 302AO in the time interval in which a clock signal pulse moves from the (2n−1)th gate section to the (2n+1)th gate section. As a result, the dependence of the delay time differentials between the external clock signal and the output of delay circuit sub-bank 302A upon the cycle of the external clock signal exhibits a sawtooth waveform characteristic having an amplitude which is the delay time of the time for a gate of delay circuit sub-bank 302A to move from the (n)th section to the (n+1)th section and having a cycle with is the time interval to move from the (2n−1)th gate section to the (2n+1)th gate section, as shown by the dotted line 302AOW in FIG. 18A.

Regarding the dependence of the delay time of delay circuit sub-bank 302AE upon the cycle of external clock signals, in actual practice, the clock signal cycle employed in the n gate sections of delay circuit sub-bank 302AE is generated when a pulse is sent to delay circuit sub-bank 302AE in the time interval in which a clock signal pulse moves from the (2n)th gate section to the (2n+2)th gate section. As a result, the dependence of the delay time differential between the external clock signal and the output of delay circuit sub-bank 302A upon the cycle of the external clock signal exhibits a sawtooth waveform characteristic having an amplitude which is the delay time of the time for a gate of delay circuit sub-bank 302A to move from the (n)th section to the (n+1)th section and a cycle which is the time interval to move from the (2n)th gate section to the (2n+2)th gate section, as shown by the solid line 302AEW in FIG. 18A.

Figure 18A:
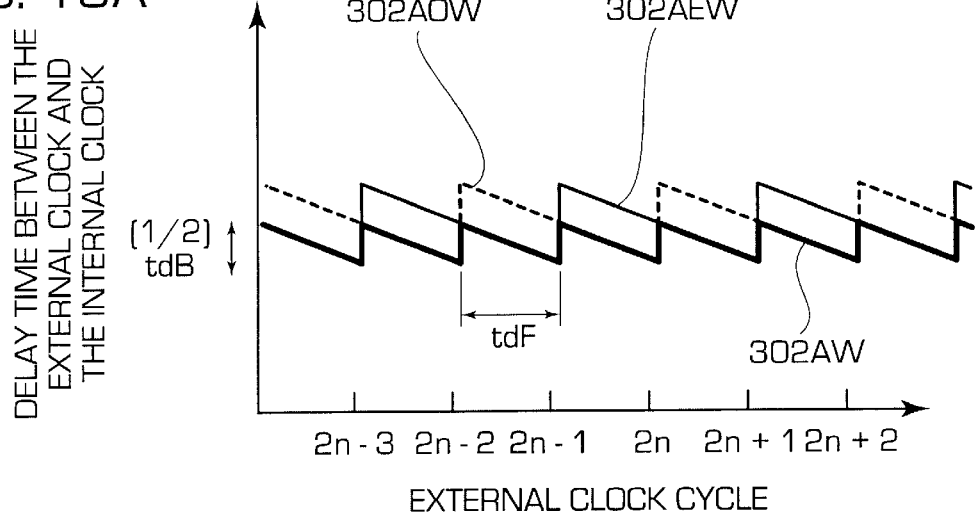
FIGS. 18A, 18B, 18C shows characteristics charts showing the dependence of the delay time differential between the external clock and internal clock upon the external clock signal cycle in the multiplex synchronous delay circuit of FIGS. 15 and 16.

Finally, the dependence on the external clock signal of delay circuit sub-banks 302AO and 302AE, as shown in FIG. 18A, has a shift, which is the time interval for a clock signal pulse to move from the (2n)th gate to the (2n+1)th gate; and the actual dependence of the output of delay circuit bank 302A upon the cycle of the external clock signal is multiplexed by the logic output of solid line 302AEW and dotted line 302AOW and therefore exhibits a sawtooth waveform characteristic having an amplitude that is one-half the delay time of the time for a gate of delay circuit bank 302A to move from the (n)th section to the (n+1)th section and a cycle which is the time to move from the (2n)th gate to the (2n+1)th gate.

Figure 18B:
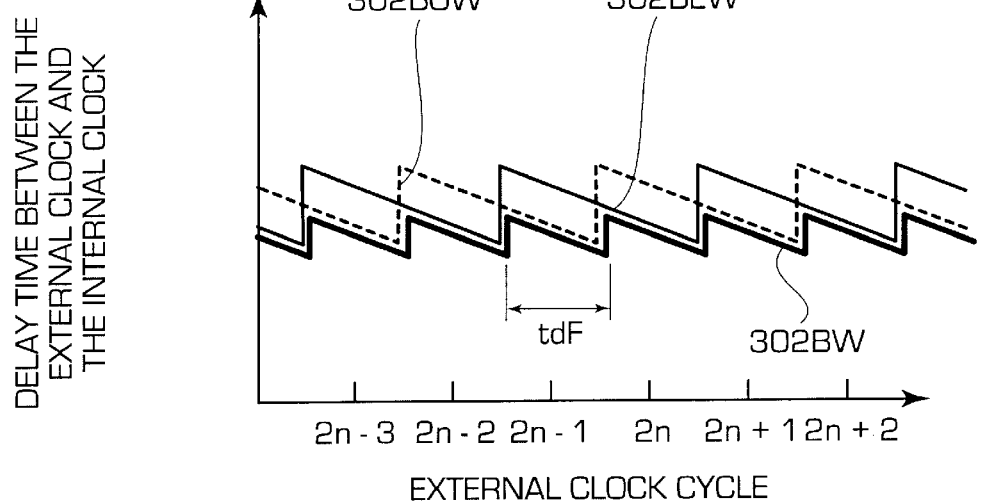
Figure 18C:
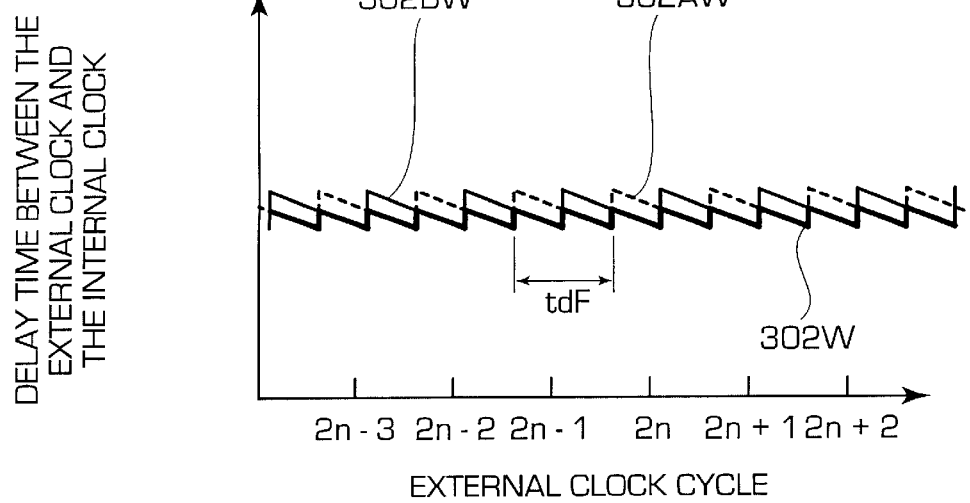

Explanation will next be given regarding the dependence of delay circuit bank 302B of second synchronous delay circuit 300B upon the cycle of the external clock signal. The constructions of first synchronous delay circuit 300A and second synchronous delay circuit 300B are substantially equivalent; and the dependence of the output of delay circuit bank 302B on the cycle of the external clock signal, as shown by 302BEW and 302BOW in FIG. 18B, has an amplitude of one-half the delay time tdB, i.e., the time for the gate of delay circuit bank 302B to move from the (n)th section to the (n+1)th section, with respect to the cycle, which is the interval of movement from the (2n)th gate section to the (2n+1)th gate section of delay circuit bank 301B.

Figure 1A:
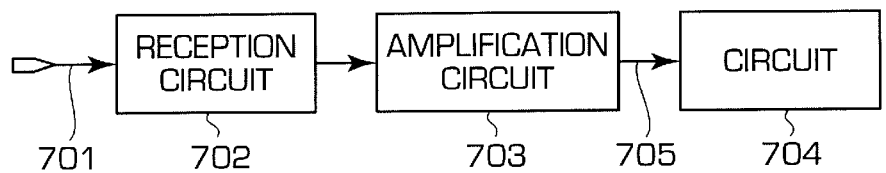
FIGS. 1A and 1B shows a block diagram and waveform chart that show the internal clock signal generation circuit and operation of a semiconductor device of the prior
Figure 1B:
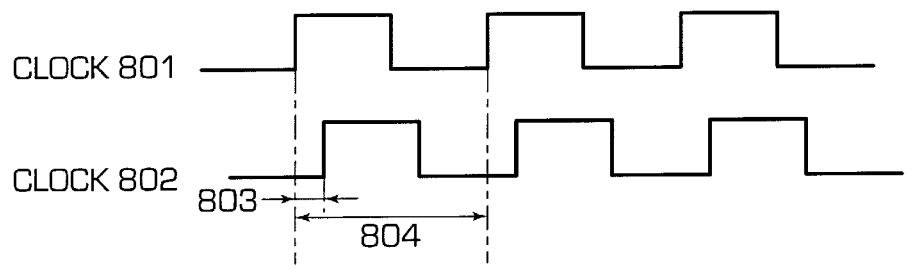
Figure 2:
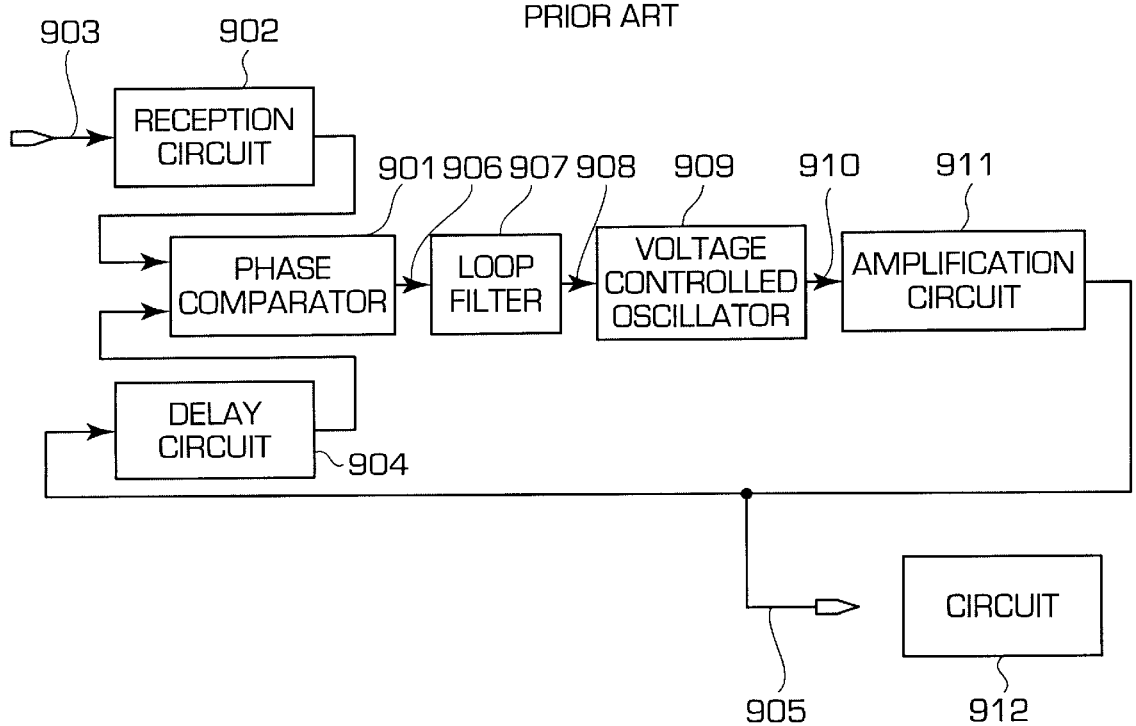
FIG. 2 is a block diagram showing a prior-art internal clock signal generation circuit realized by using a PLL circuit.
Figure 3:
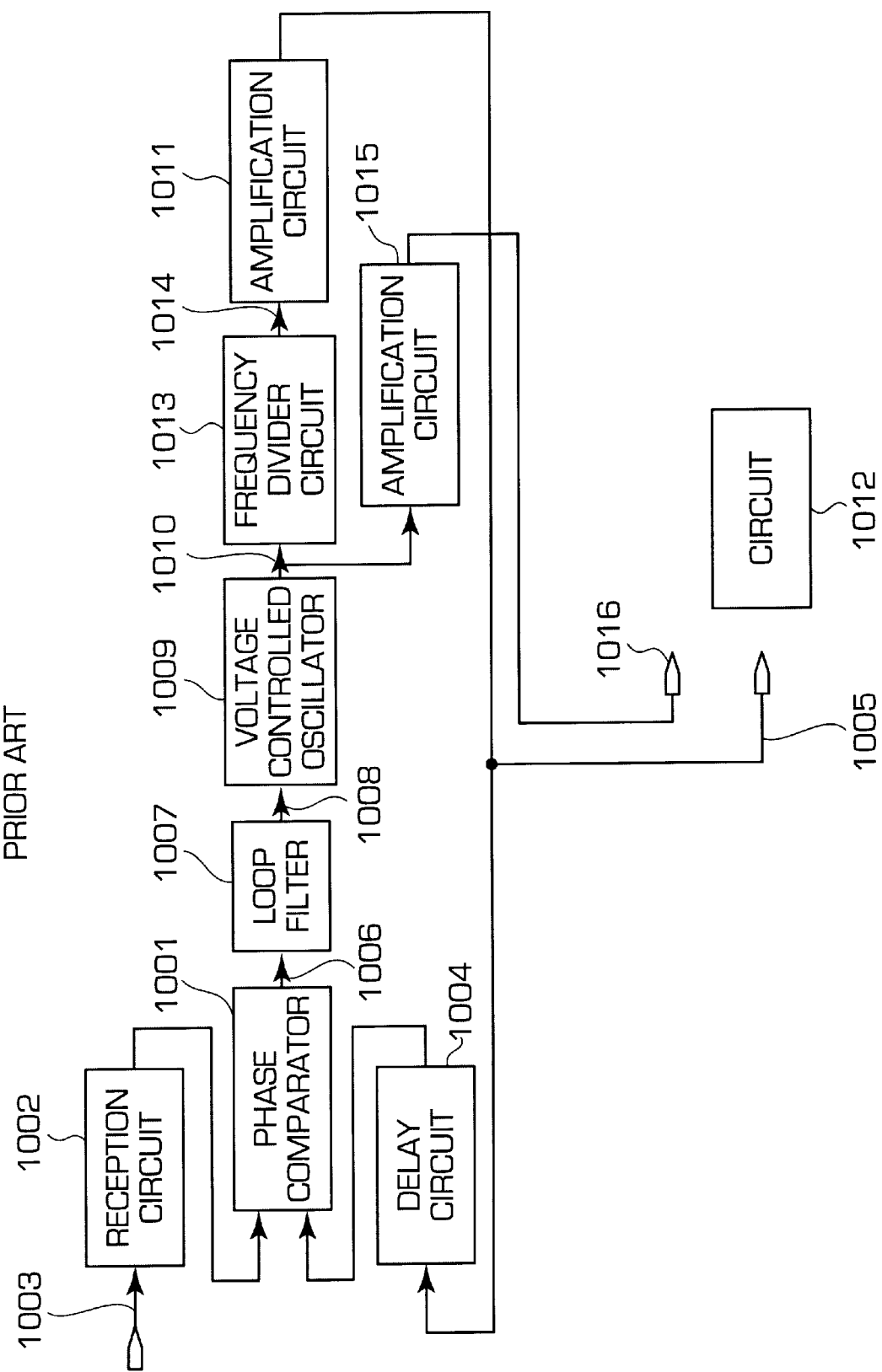
FIG. 3 is a block diagram showing another prior-art internal clock signal generation circuit realized by using a PLL circuit.
Figure 4:
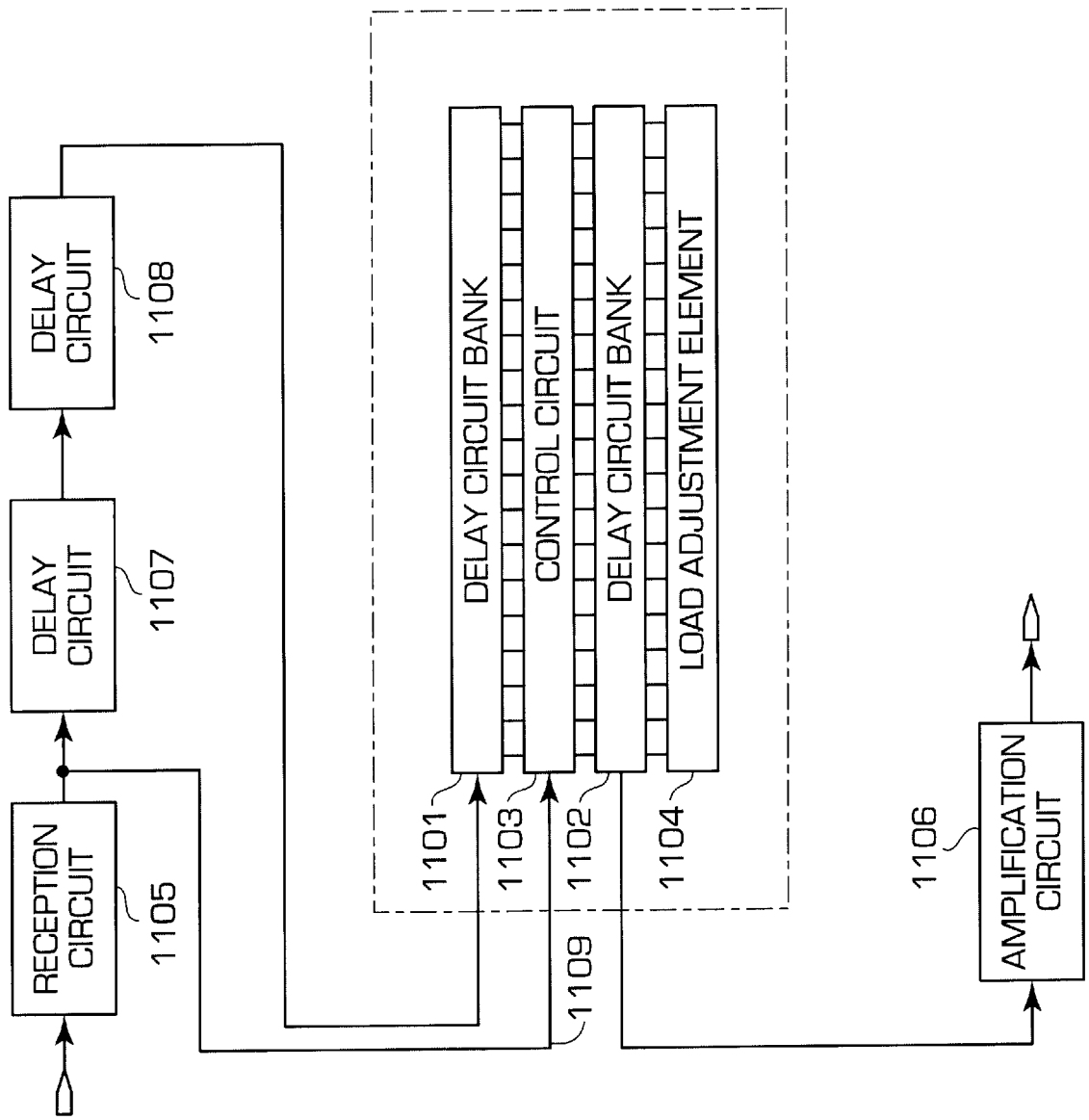
FIG. 4 is a block diagram showing an example of a delay circuit device of the prior art.
Figure 5:
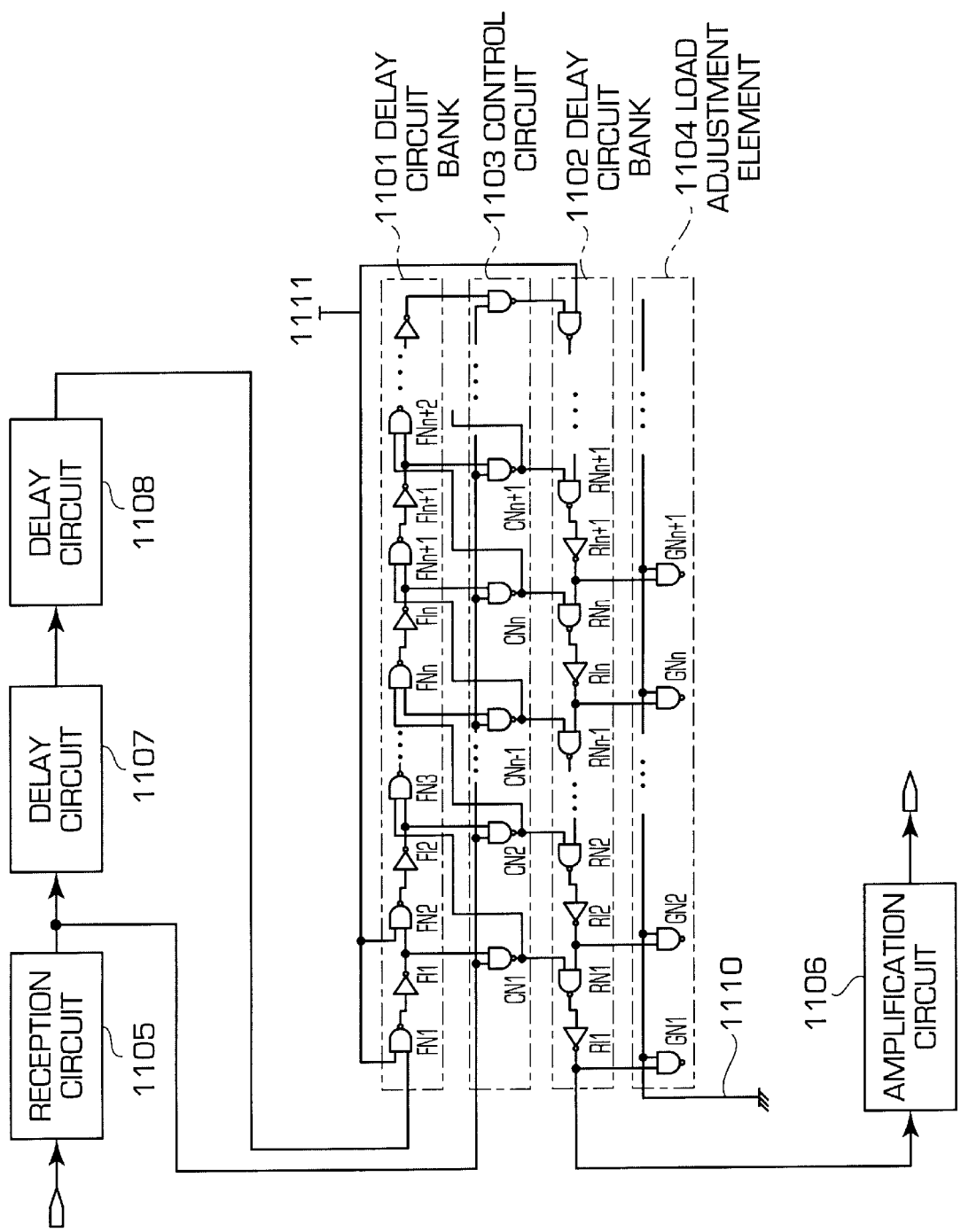
FIG. 5 is a circuit diagram showing details of the construction of the synchronous delay circuit portion of the example of a delay circuit device shown in FIG. 4.
Figure 6:
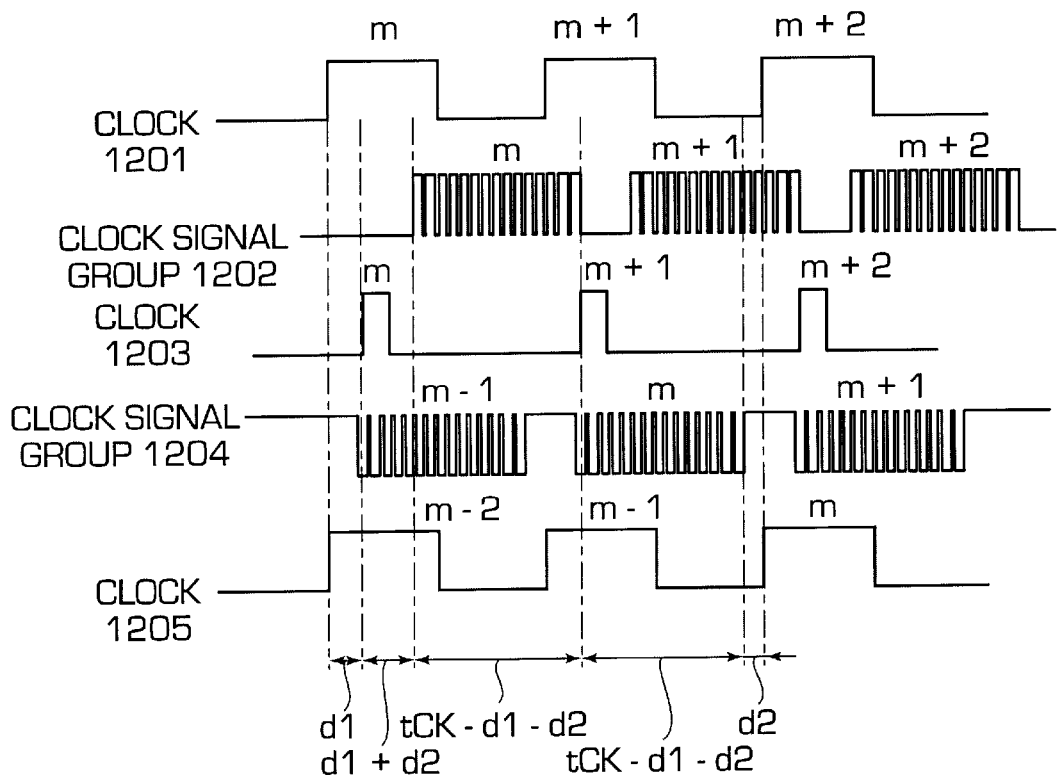
FIG. 6 is a waveform chart showing the internal operation of the example of a delay circuit device of FIG. 4.
Figure 7:
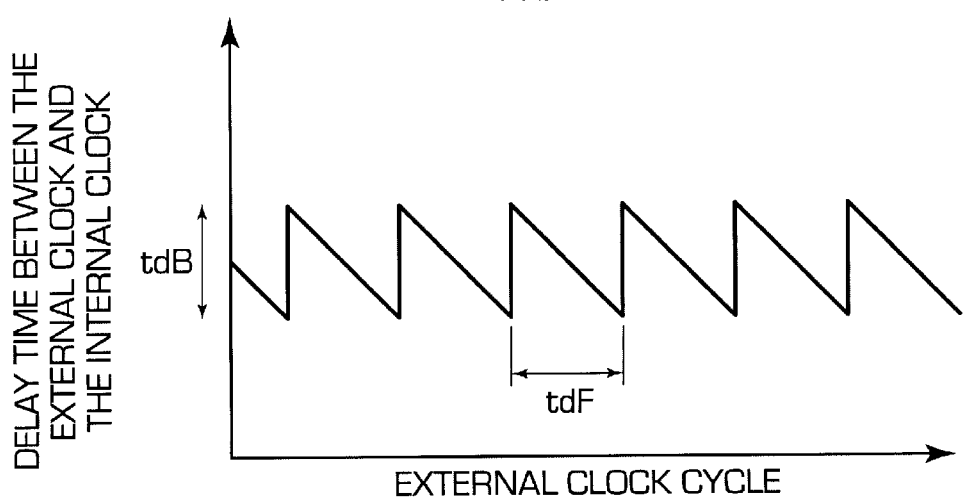
FIG. 7 is a characteristics chart showing the dependence of the delay time differential between the external clock and internal clock upon the external clock signal cycle in the multiplex synchronous delay circuit of FIG. 4.

As for the dependence of the output of second synchronous delay circuit 300B on the cycle of the external clock signal, because of the shift of one-half tdF, which is exactly a one-half gate portion, with respect to the timing of first synchronous delay circuit 300A due to delay circuit 301BA and delay circuit 302BA, the dependence of the output of the delay circuit of this invention upon the external clock signal cycle exhibits the sawtooth characteristic shown by 302W in FIG. 1C which has an amplitude of one-fourth the delay time tdB of the time of movement from the (n)th section to the (n+1)th section of delay circuit bank 302A or 302B with respect to one-half of a cycle, which is the delay time tdF of the gate section of delay circuit bank 301A or 301B.

The output of multiplex circuit 312 passes by way of frequency divider 313, where its pulse width becomes exactly one-half the clock signal cycle, and is amplified to the desired drive capacity at amplification circuit 306.

As described hereinabove, the present embodiment enables generation of a double-cycle clock signal and generation of a clock signal having a duty of 50%, which in a prior-art PLL required from several tens to several ten thousands of cycles, after one clock signal cycle, and moreover, allows a reduction of the dependence of phase error of the output upon the external clock signal cycle to one-fourth that of the prior art.

In addition, combination with the circuit of the first embodiment enables generation of a double-cycle clock signal having no difference in delay or phase with respect to external clock signals as well as generation of a clock signal having duty of 50% having reduced dependence on external clock signal cycle.

The present embodiment enables generation of a pulse at a timing that is one-half the cycle of the clock signal by dividing delay circuit banks 302A and 302B into portions having one-half the number of elements of delay circuit banks 301A and 301B. However, as shown in FIG. 19, second synchronous delay circuit banks 302A-f and 302B-f are provided with m rows of delay circuit sub-banks each made up of a plurality of gate sections in cascade connection arranged in the reverse direction of the signal transmission path of first delay circuit banks 301A-f and 301B-f. The delay circuit sub-bank of the (d)th row of these m rows of delay circuit sub-banks parallel inputs to the gate of every (n)th section from the output side the output of every (m)th gate section from the (d)th gate section of control circuits 303A-f and 303B-f; sequentially delays these inputs, and outputs the result. An equal delay time differential is maintained and outputted in order for the output of each of these m rows of delay circuit sub-banks; and the output is multiplexed according to its logic output and outputted as delay signals; the proportion of the gates being split as desired (in FIG. 19, m:n, m>n); thereby enabling generation of a clock signal pulse of any timing.

Figure 20:
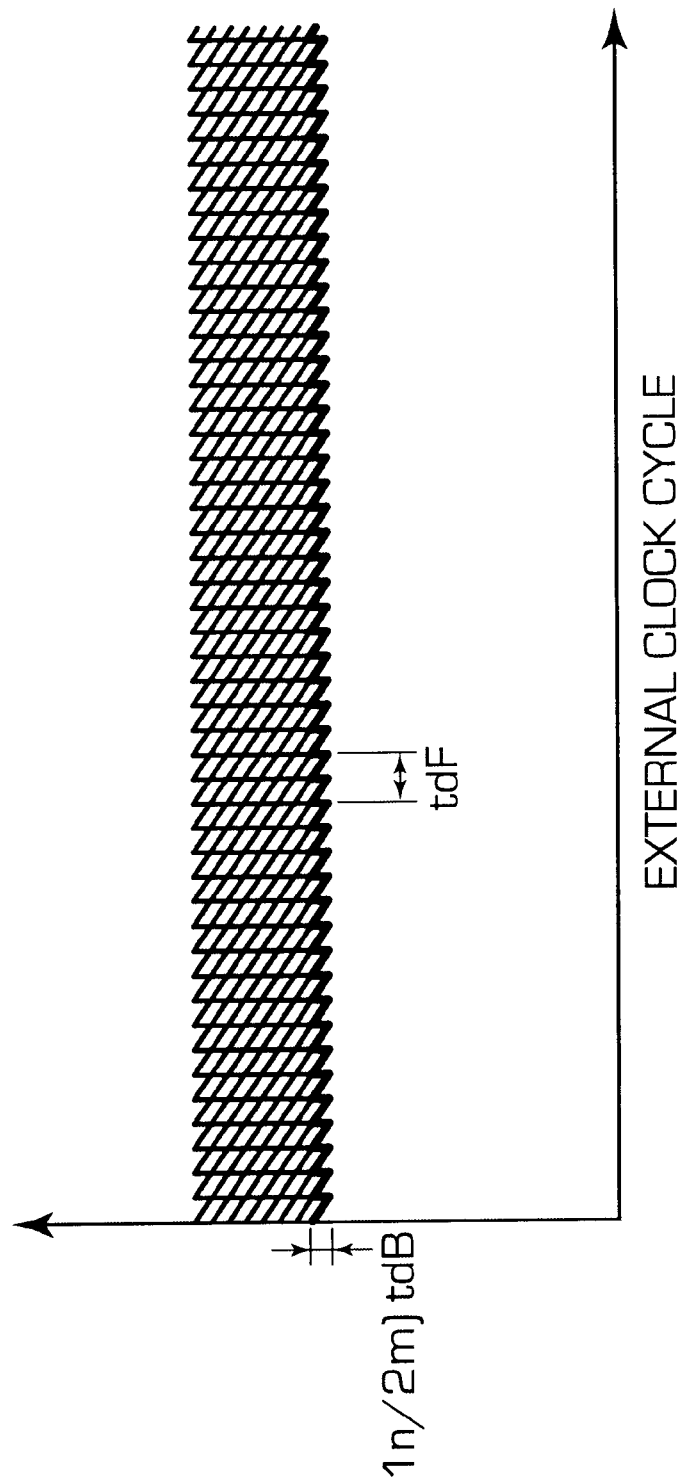
FIG. 20 is a characteristics chart showing the dependence of the delay time differential between the external clock and internal clock upon the external clock signal cycle in the multiplex synchronous delay circuit of FIG. 19.

By adding a delay circuit on the output side of each of the m rows of parallel delay circuit sub-banks such that the delay time ratio is exactly m:n and then outputting through either multiplex circuit 302AM-f or multiplex circuit 302BM-f, the dependence of the time differential upon the frequency of the external clock signal for a timing of exactly n/m of the external clock signal cycle of the output of multiplex circuits 302AM-f and 302BM-f exhibits a sawtooth characteristic having an amplitude of n/m the delay time tdB of the gate of each section of delay circuit bank 302A-f and 302B-f and a cycle which is the delay time tdF of the gate of each section of delay circuit bank 301A-f and 301B-f. In addition, passage through multiplex circuit 300C-f results in dependence upon the frequency of the external clock signal that exhibits a sawtooth characteristic having an amplitude of n/2m the delay time tdB at a cycle of ½ the delay time tdF, as shown in FIG. 20.

Figure 21B:
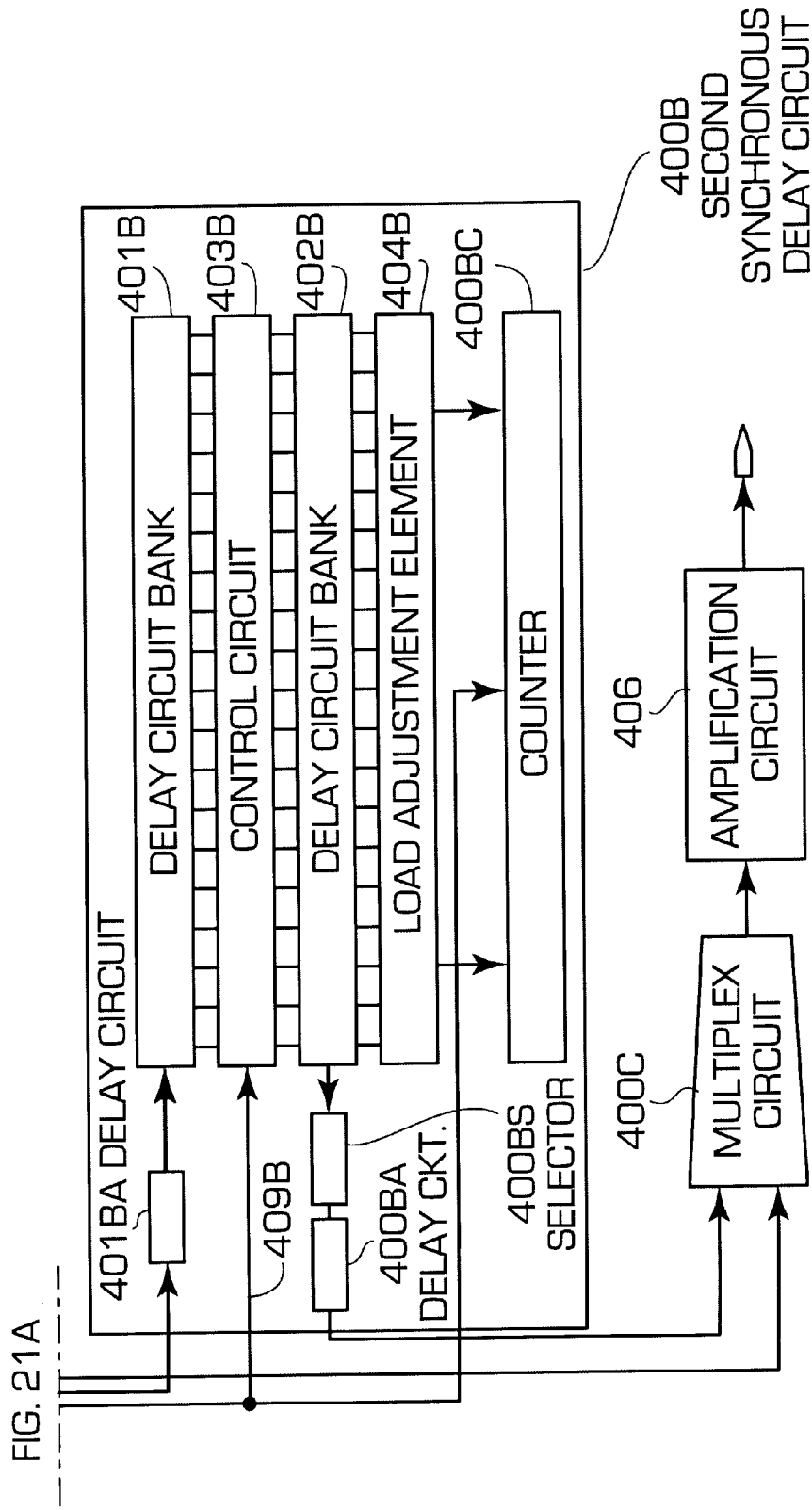

Referring to FIG. 21, the third embodiment of the multiplex synchronous delay circuit of the present invention is made up of a configuration in which the synchronous delay circuits 100A and 100B of the multiplex synchronous delay circuit of the first embodiment shown in FIG. 8 are replaced by first and second synchronous delay circuits 400A and 400B, respectively. The other blocks of the circuit have the same configuration and operation and explanation is therefore here omitted.

First synchronous delay circuit 400A, which is the feature of the multiplex synchronous delay circuit of this embodiment, is made.up of: delay circuit 401AA which is an input delay adjustment circuit that inputs signals corresponding to the pulse signal and equally adjusts each delay time differential; first delay circuit bank 401A composed of a plurality of gate sections in cascade connection and loop connection that inputs and sequentially delays the output of delay circuit 401AA and parallel outputs the output of each of the gate sections in the order of the gate sections from the input side; control circuit 403A that parallel inputs the output of each of the gate sections of first delay circuit bank 401A, synchronizes with the pulse signal, and parallel outputs each result; second delay circuit bank 402A composed of a plurality of gate sections in cascade connection and loop connection arranged in the reverse direction of the signal transmission path of first delay circuit bank 401A that parallel inputs to each of the gate sections each output of control circuit 403A in the order of the gate sections from the output side; sequentially delays these inputs, and outputs the result; count circuit 400AC that counts up each time a signal corresponding to the pulse signal makes a circuit within first delay circuit bank 401A, counts down each time the signal makes a circuit within second delay circuit bank 402A, and outputs a signal indicating that the number of circuits within first and second delay circuit bank 401A and 402A are equal; selector circuit 400AS that, in accordance with output of count circuit 400AC, extracts from output a signal corresponding to the pulse signal circulating within second delay circuit bank 402A; and output delay adjustment circuit 402AA that inputs output of the selector circuit, equally adjusts delay time differentials, and outputs the result as the delay signals. Second synchronous delay circuit 400B has an equivalent construction.

Figure 22:
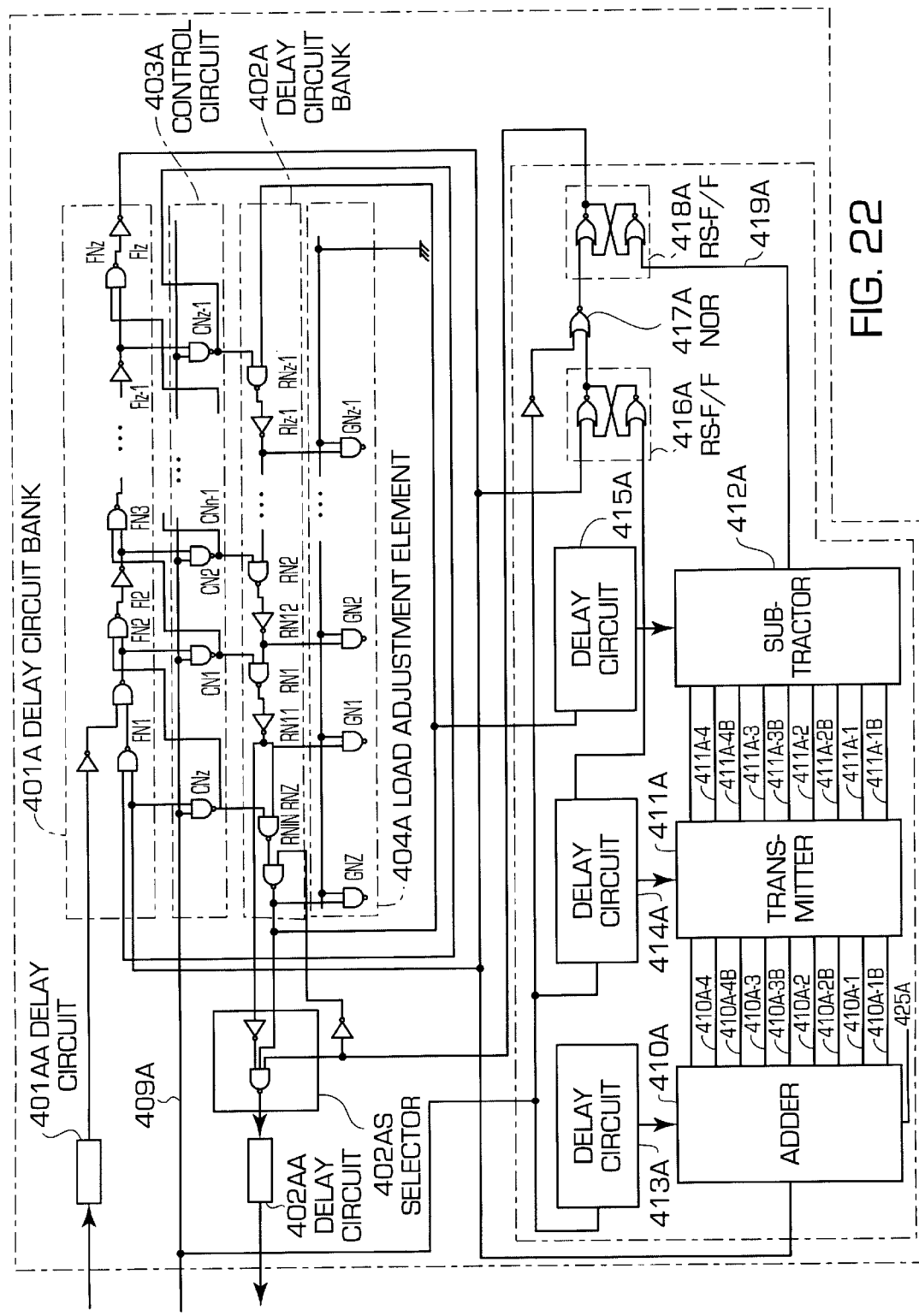
FIG. 22 is a circuit diagram showing an example of the internal configuration of first synchronous delay circuit 400A in FIG. 21.

Referring to FIG. 22, which is a block diagram showing an example of the construction of this synchronous delay circuit 400A, count circuit 400AC is made up of adder 410A that counts up each time a signal corresponding to the pulse signal makes a circuit within first delay circuit bank 401A; transmitter 411A that parallel inputs the output of the adder 410A, synchronizes to the pulse signal, and parallel outputs each of the results; and subtracter 412A that parallel inputs the output of transmitter 411A, and counts down each time a signal corresponding to the pulse signal makes a circuit within second delay circuit bank 402A.

The first and second synchronous delay circuits 400A and 400B, although substantially equivalent to first and second synchronous delay circuits 100A and 100B of the first embodiment shown in FIG. 9, have two points of difference as explained hereinbelow.

The first point of difference is that delay circuit bank 401A and 402A are in loop connection. In other words, as shown in FIG. 22, the output of the last inverter FIz of delay circuit bank 401A is inputted to the first NAND circuit FN1 of delay circuit bank 401A, output from the second from the last NAND circuit CNz-1 of control circuit 403A is inputted to the first NAND circuit FN1 of delay circuit bank 401A, the output of the last NAND circuit CNz of control circuit 403A is inputted to the second from the beginning NAND circuit FN2 of delay circuit bank 401A, NAND circuit FNIN is arranged at the section following NAND circuit FN1 instead of inverter FI1, and the output of delay circuit 401AA is inputted to FNIN by way of an inverter. The output of the first inverter RI1 of delay circuit bank 402A is inputted to the last NAND circuit RNz of delay circuit bank 402A and to selector 400AS; NAND circuit RNIN is arranged at the section following the last NAND circuit RNz of delay circuit bank 402A in place of inverter RIz; and the output of count circuit 400AC, which is a counting means, is inputted by way of an inverter, outputted to selector 400AS, and outputted to subtracter 412A by way of delay circuit 415A.

Pulse signals outputted from reception circuit 405 are inputted to delay circuit 407 and control circuit 403A, to adder 410A by way of delay circuit 413A, to transmitter 411A by way of delay circuit 414A, and to RS-F/F418A by way of an inverter and NOR circuit 417A. The output of delay circuit 407 is inputted to delay circuit bank 401A by way of delay circuit 408 and delay circuit 401AA. A high-level pulse entering delay circuit bank 401A advances through delay circuit bank 401A during the interval until output of the next high-level pulse from reception circuit 405, and if the pulse reaches the last inverter FIz of delay circuit bank 401A, it returns to the first NAND circuit FN1 and continues its circuit.

The second point of difference is the provision of count circuit 400AC. This count circuit 400AC is basically made up of adder 410A, transmitter 411A, and subtracter 412A. Adder 410A counts the high-level pulse output from inverter FIz of delay circuit bank 401A during the interval from the output of a high-level pulse from reception circuit 405 until the output of the next high-level pulse. In this embodiment, the adder 410A output is the addition results indicated by the 4-bit output 410A-1, 410A-1B, 410A-2, 410A-2B, 410A-3, 410A-3B, 410A-4, and 410A-4B. When a high-level pulse is outputted from reception circuit 405, the output of adder 410A is transmitted by way of transmitter 411A to subtracter 412A as the 4-bit output 411A-1, 411A-1B, 411A-2, 411A-2B, 411A-3, 411A-3B, 411A-4, and 411A-4B.

When a high-level pulse is outputted from reception circuit 405, the high-level pulse within delay circuit bank 401A is transmitted to delay circuit bank 402A where it proceeds through delay circuit bank 402A as a low-level pulse, is inputted to NAND circuit RNz upon reaching inverter RI1, and again proceeds through delay circuit bank 402A. The count number transmitted to subtracter 412A counts down upon output of a low-level pulse from inverter RI1 of delay circuit bank 402A, and upon reaching "0," the subtracter output 419A alters its state from low level to high level, fixes the output of NAND circuit RNIN of delay circuit bank 402A to high level and simultaneously causes the output of inverter RI1 of delay circuit bank 402A to be outputted by way of selector 400AS, and then outputted by way of delay circuit 402AA, multiplex circuit 400C, and amplification circuit 406.

At this time, if the high-level pulse within delay circuit bank 401A does not reach the last inverter FIz of delay circuit bank 401A during the interval from the exit of one high-level pulse until the next high-level pulse from reception circuit 405, the output 419A of subtracter 412A remains unchanged in a high-level state, and as a result, the pulse transmitted from delay circuit bank 401A to delay circuit bank 402A causes the output of inverter RI1 of delay circuit bank 402A from NAND circuit RNIN to be outputted by way of selector 400AS, delay circuit 402AA, multiplex circuit 400C, and amplification circuit 406.

When the count value of adder 410A indicates the maximum value, i.e., when the 4-bit outputs 410A-1 to 410A-4 are all high-level output, maximum cycle violation signal 425A is outputted from adder 410A.

Figure 23:
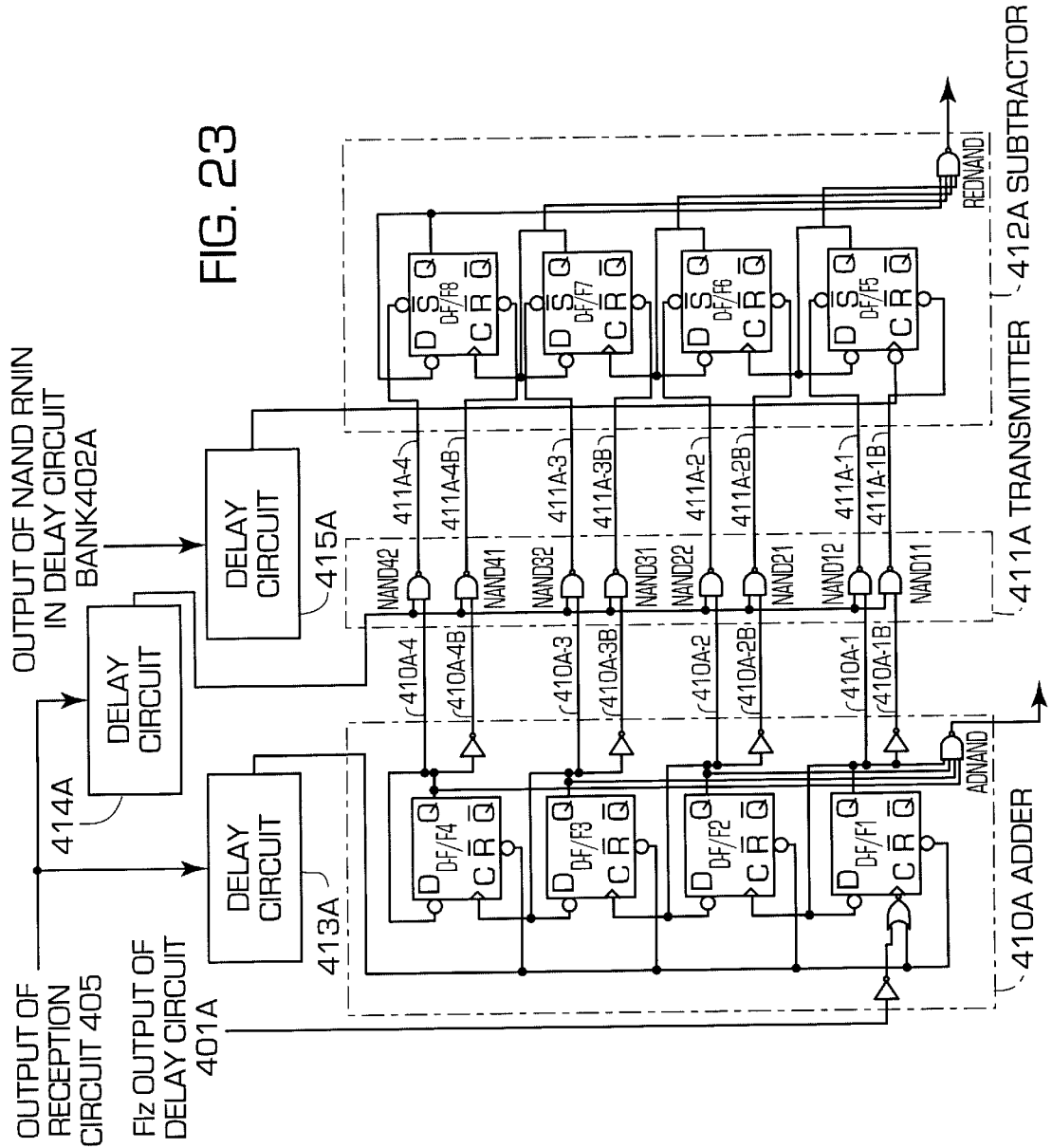
FIG. 23 is a circuit diagram showing an example of the internal configuration of counter 400AC in FIG. 21 and FIG. 22.

Details regarding the structure of adder 410A, transmitter 411A, and subtracter 412A of count circuit 400AC will next be described with reference to FIG. 23.

Adder 410A is made up of four resettable D-flip-flop circuits D-F/F1 to D-F/F4. To the C terminal of D-F/F1 is inputted the NOR gate output of the output of an inverter that inverts the output of inverter FIz of delay circuit bank 401A and the output of delay circuit 413A. To each of the other C terminals of D-F/F2 to D-F/F4 is inputted the Q-terminal output 410A-1 to 410A-3 of the preceding D-flip-flop D-F/F1 to D-F/F3, respectively. In addition, the Q-terminal output 410A-1 to 410A-4 of each D-flip-flop D-F/Fl to D-F/F4 is outputted to the D terminal of the same D-flip-flop, to a respective inverter IA1 to IA4, to a 4-input NAND circuit ADNAND, and to transmitter 411A.

Transmitter 411A is provided with NAND12, NAND22, NAND32, and NAND42 that parallel input the Q-terminal outputs 410A-1 to 410A-4, respectively, of adder 410A; gate these inputs by means of the output of delay circuit 414A; and parallel output the outputs 411A-1 to 411A-4; and with NAND11, NAND21, NAND31, and NAND41 that parallel input the inverted Q-terminal outputs 410A-1B to 410A-4B, respectively, of adder 410A; gate these inputs by means of the output of delay circuit 414A; and parallel output the outputs 411A-1B to 411A-4B.

Subtracter 412A is made up of four settable and resettable D-flip-flops D-F/F5 to D-F/F8. The output of NAND circuit RNIN of delay circuit bank 402A is inputted to the C-terminal of D-F/F5 by way of delay circuit 415A. The Q-terminal output of each D-flip-flop D-F/F5 to D-F/F7 is inputted to the C-terminal of the succeeding D-flip-flop D-F/F6 to D-F/F8, respectively. The set terminal of each of D-flip-flops D-F/F5 to D-F/F8 inputs the output 411A-1 to 411A-4 of transmitter 411A, and the reset terminal of each of D-flip-flops D-F/F5 to D-F/F8 inputs the output 411A-1B to 411A-4B of transmitter 411A. In addition, the Q-terminal output of each D-flip-flop D-F/F5 to D-F/F8 is outputted to the D-terminal of the same D-flip-flop and to 4-input NAND circuit REDNAND. The output of this 4-input NAND circuit REDNAND is inputted to RS-F/F418A as the output 419A of subtracter 412A.

As explained hereinabove, in the present embodiment, by connecting delay circuit bank 401A and delay circuit bank 402A in loop form, and moreover, providing a counter, it has become possible to control a clock signal having a cycle that is longer by a multiple of the number that can be counted by the counter of the maximum delay time of delay circuit bank 401A and delay circuit bank 402A.

In other words, if the delay time until an arbitrary NAND circuit FNn and the succeeding inverter FIn of delay circuit bank 401A is defined as dF and the delay time until an arbitrary NAND circuit RNn and the succeeding inverter RIn of delay circuit bank 402A is defined as dR, the delay time from the first NAND circuit FN1 until the last inverter FIz of delay circuit bank 401A is zdF, and the delay time from first NAND circuit RNz until the last inverter RI1 of delay circuit bank 402A is zdR. In a case in which the delay between the internal clock signal and the external clock signal is to be eliminated, a setting that makes dF and dR equal also makes zdF and zdR equal.

In this case, if the delay time of delay circuit 107 and delay circuit 108 is d1+d2 and the clock signal cycle of input is shorter than zdF+d1+d2, as shown in the first and second embodiments, a clock signal pulse proceeding through delay circuit bank 401A is transmitted from delay circuit bank 401A to delay id circuit bank 402A at the next clock signal pulse and passes through the same number of NAND circuits and inverters within delay circuit bank 401A and delay circuit bank 402A.

On the other hand, if the input clock signal cycle is longer than zdF+d1+d2, the pulse continues to circulate around delay circuit bank 401A until input of the next clock signal and the number of times that the pulse passes from end to end of delay circuit bank 401A is counted at adder 410A. Upon input of the next clock signal, the pulse is transmitted from delay circuit bank 401A to delay circuit bank 402A and the number of times the pulse has passed from end to end of delay circuit bank 401A counted at adder 410A is simultaneously sent to subtracter 412A, and subtraction occurs each time the pulse passes through inverter RI1 of delay circuit bank 402A. Because the pulse circulates from end to end of delay circuit bank 402A the same number of times as it passes from end to end of delay circuit bank 401A, delay circuit bank 401A and delay circuit bank 402A can be used repeatedly, and similarly to cases in which the clock signal cycle of input is shorter than zdF+d1+d2, the same effect can be expected as when the clock signal is of longer cycle because the pulse passes through the same number of NAND circuits and inverters in both delay circuit bank 401A and delay circuit bank 402A.

Figure 24:
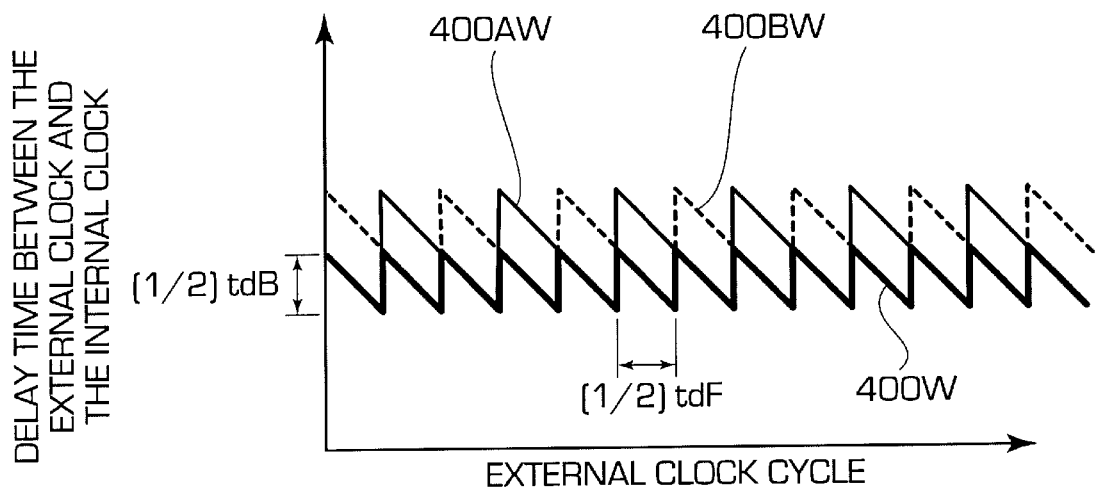
FIG. 24 is a characteristics chart showing the dependence of the delay time differential between the external clock and internal clock upon the external clock signal cycle in the multiplex synchronous delay circuit of FIG. 21.

The circuit structure and operation characteristics of second synchronous delay circuit 400B are equivalent to that of first synchronous delay circuit 400A with the exception of the delay time differentials between delay circuit 401AA and delay circuit 401BA and between delay circuit 402AA and delay circuit 402BA. The delay time differential between delay circuit 401AA and delay circuit 401BA is equal to one-half of tdF as explained in the preceding section, and the delay time differential between delay circuit 402AA and delay circuit 402BA is equal to one-half tdB, also as explained in the preceding section. Therefore, as in the first and second embodiments, the dependence of the delay time differential between the external clock signal and the internal clock signal upon the external clock signal cycle exhibits a sawtooth form having an amplitude and cycle of one-half that for first synchronous delay circuit 400A alone, as shown in FIG. 24.

Figure 25:
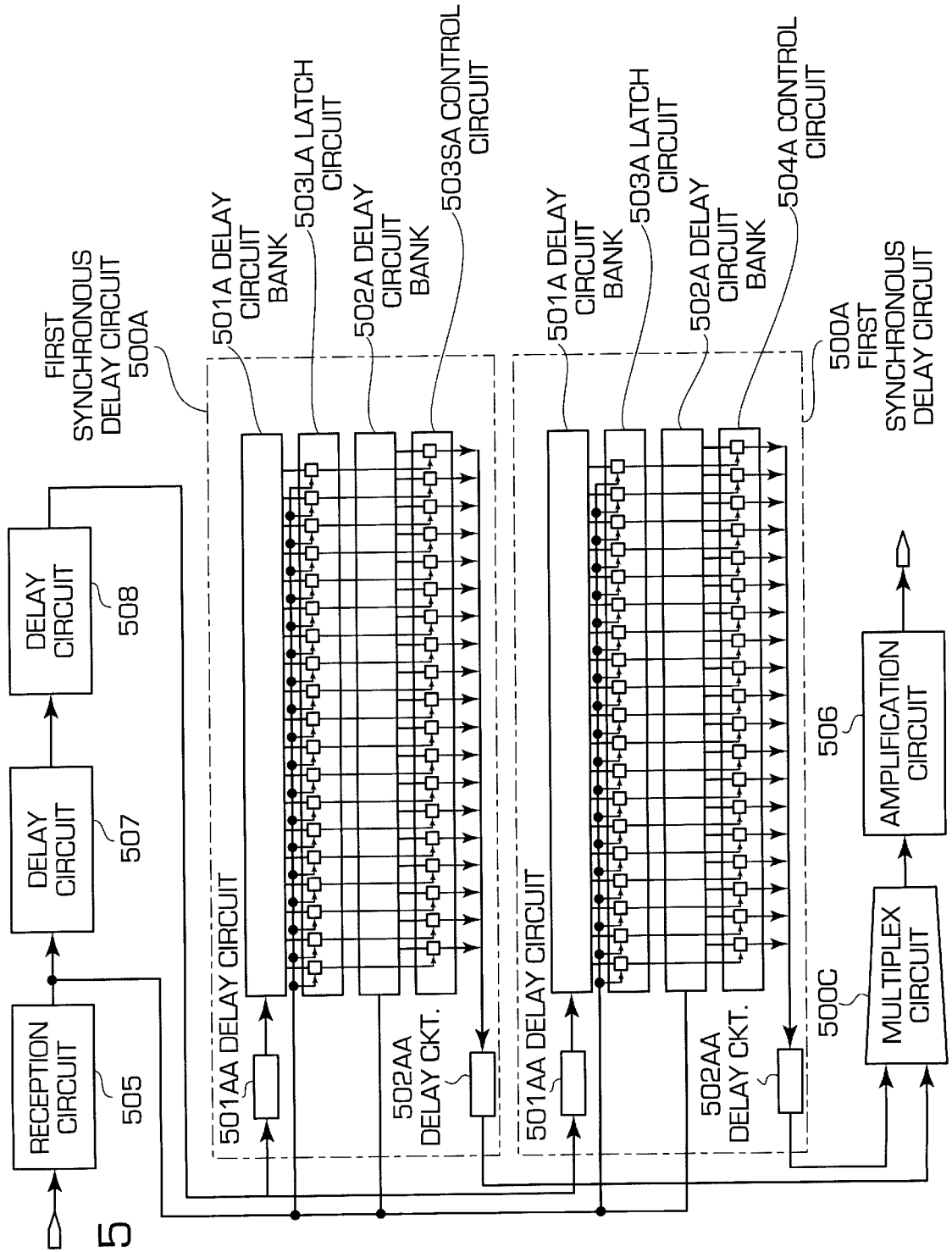
FIG. 25 is a block diagram showing the fourth embodiment of the multiplex synchronous delay circuit of the present invention.

Referring to FIG. 25, the fourth embodiment of the multiplex synchronous delay circuit of the present invention is of a construction in which first and second synchronous delay circuits 500A and 500B are arranged in place of synchronous delay circuits 100A and 100B, respectively, of the first embodiment of the multiplex synchronous delay circuit shown in FIG. 8. The other blocks being equivalent, explanation of their construction and operation is here omitted.

First synchronous delay circuit 500A, which is the feature of the multiplex synchronous delay circuit of this embodiment, is made up of: delay circuit 501AA, which is an input delay adjustment circuit which inputs a signal corresponding to the pulse signal and equally adjusts each delay time differential; first delay circuit bank 501A made up of a plurality of gate sections in cascade connection that inputs and sequentially delays the output of delay circuit 501AA and parallel outputs the output of each gate section in the order of the gates from the input side; latch circuit 503LA that parallel inputs the output of each gate section of first delay circuit bank 501A, synchronizes with the pulse signal, latches each, and parallel outputs the result; second delay circuit bank 502A made up of a plurality of gate sections in cascade connection arranged in the same direction as the signal transmission path of first delay circuit bank 501A that inputs and sequentially delays the pulse signal and parallel outputs the output of each gate section in the order of the gates from the input side; control circuit 503SA that parallel inputs the output of each gate section of second delay circuit bank 502A, controls the output of each gate section in accordance with each parallel output of latch circuit 503A, and wired OR outputs the result; delay circuit 502AA which is an output delay adjustment circuit that inputs the output of control circuit 503SA, equally adjusts each delay time differential, and outputs the result as the delay signals. Second synchronous delay circuit 500B has an equivalent structure.

Explanation will next be presented regarding the operation of these synchronous delay circuits. As in the first to third embodiment explained hereinabove, first synchronous delay circuit 500A and second synchronous delay circuit 500B have equivalent structure, and explanation will therefore be given for the first synchronous delay circuit 500A. As in the explanation of the first embodiment, the clock signal pulse is inputted cyclically, and each individual pulse need not be distinguished in actual use, but for the sake of clarifying the explanation of operation, one arbitrary clock signal pulse is identified as the (m)th clock signal, the succeeding clock signal pulse is identified as the (m+1)th clock signal pulse, and the following clock signal pulse is identified as the (m+2)th clock signal pulse.

After reception circuit 505, the (m)th clock signal pulse enters delay circuit bank 501A by way of delay circuit 507 and delay circuit 508 having delay times equal to reception circuit 505 and amplification circuit 506, respectively, and proceeds through delay circuit bank 501A. One clock signal cycle after the (m)th clock signal pulse exits reception circuit 505, the [m+1]th clock signal pulse is inputted to latch circuit 503LA from reception circuit 505. At this time, the (m)th clock signal pulse is proceeding through delay circuit bank 501A, and if, for example, the pulse is then proceeding through the (j)th delay element in delay circuit bank 501A, the output of the (j)th delay element is outputted at high level as previously explained.

Accordingly, both inputs of the (j)th latch circuit 503LA, which is connected to the output of the (j)th delay element through which the (m)th clock signal pulse is preceding, become high level, and the output of the (j)th latch circuit 503LA places the (j)th control circuit 503SA in a state capable of output. At this time, the [m+1]th clock signal pulse is inputted from reception circuit 505 to delay circuit bank 502A, advances as far as the (j)th delay element within delay circuit bank 502A, passes through multiplex circuit 500C by way of (j)th control circuit 503SA, and is outputted from amplification circuit 506.

In this embodiment as well, the time of progression of a pulse passing through delay circuit bank 501A is equal to the clock signal cycle less the delay times of delay circuit 507 and delay circuit 508, and the time of progression of a pulse through delay circuit bank 502A is equal to that of a pulse advancing through delay circuit bank 501A, and as a result, the time of progression of a pulse that passes through delay circuit bank 502A, from the time of entering reception circuit 505 to output from amplification circuit 506, is exactly one cycle. This embodiment therefore enables elimination of the delay time differential between the external clock signal and the internal clock signal without need for considering the delay time of the delay elements within the delay circuits.

As in the first embodiment, in this embodiment, the delay time differentials between the external clock signal (the (m+2)th clock signal pulse) and the internal clock signal (the output of the (m)th clock signal pulse from amplification circuit 506 has some dependence upon the external clock signal cycle. However, in this embodiment as well, the dependence of the delay time differential between the external clock signal and the internal clock signal in the first and second synchronous delay circuits 500A and 500B upon the external clock signal cycle is shifted by adjusting the delay time differentials between delay circuit 501AA and delay circuit 501BA and between delay circuit 502AA and delay circuit 502BA. This embodiment therefore enables a reduction of the dependence upon the external clock cycle of the delay time differential between the external clock signal and a multiplexed delay signal obtained by multiplexing the output of first and second synchronous delay circuits 500A and 500B by means of multiplex circuit 500C.

While preferred embodiments of the present invention have been described using specific terms, such description is for illustrative purposes only, and it is to be understood that changes and variations may be made without departing from the spirit or scope of the following claims.

What is claimed is:

1. A multiplex synchronous delay circuit comprising:
   a plurality of synchronous delay circuit means, wherein pulse signals are input into a plurality of gate sections in cascade connection within each of said synchronous delay circuit means, and said pulse signals are transmitted through said gate sections in sequential delays, and said gate sections output in parallel and are synchronized with said pulse signals, and wherein, based on each output in parallel, delay signals output from said plurality of synchronous delay circuit means have a fixed delay time corresponding to said pulse signals, and delay time differentials between said plurality of synchronous delay circuit means are maintained in sequential order; and
   a multiplex circuit means that inputs each of said delay signals, multiplexes said delay signals, and outputs the result as multiplex delay signals.

2. A multiplex synchronous delay circuit according to claim 1 wherein each of said synchronous delay circuit means comprises:
   an input delay adjustment circuit that inputs a signal corresponding to said pulse signal and equally adjusts each of said delay time differentials;
   a first delay circuit bank made up of a plurality of gate sections in cascade connection that inputs and sequentially delays output of said input delay adjustment circuit and parallel outputs output of each of said gate sections in the order of the gate sections starting from the input side;
   a control circuit that parallel inputs output of each gate section of said first delay circuit bank, synchronizes with said pulse signal, and parallel outputs each result;
   a second delay circuit bank made up of a plurality of gate sections in cascade connection arranged in the reverse direction of the signal transmission path of said first delay circuit bank that parallel inputs to each gate section each output of said control circuit in the order of said gate sections from the output side, sequentially delays these inputs, and outputs the result; and
   an output delay adjustment circuit that inputs output of said second delay circuit bank, equally adjusts each of said delay time differentials, and outputs the result as one of said delay signals.

3. A multiplex synchronous delay circuit according to claim 2 wherein said second delay circuit bank comprises m rows of delay circuit sub-banks each made up of a plurality of gate sections in cascade connection arranged in the reverse direction of the signal transmission path of said first delay circuit bank, and
   the (d)th delay circuit sub-bank of said m rows of delay circuit sub-banks includes means for parallel inputting to every (n)th gate section from the output side the output of every (m)th gate section from the (d)th gate section of said control circuit, sequentially delays these inputs, and outputs the result; means for maintaining equal delay time differentials with respect to output of each of these m rows of delay circuit sub-banks and sequentially outputting the result; and means for multiplexing of these outputs and outputting the result to said output delay adjustment circuit.

4. A multiplex synchronous delay circuit according to claim 3 wherein said second delay circuit bank comprises:
   m sub-output delay adjustment circuits that input output of each of said m rows of delay circuit sub-banks, equally adjust each of said sub-delay time differentials, and output the result; and
   a sub-multiplex circuit that inputs outputs of said m sub-output delay adjustment circuits, multiplexes said output, and outputs the result.

5. A multiplex synchronous delay circuit according to claim 1 wherein each of said synchronous delay circuit means comprises:
   an input delay adjustment circuit that inputs a signal corresponding to said pulse signal and equally adjusts each of said delay time differentials;
   a first delay circuit bank made up of a plurality of gate sections in cascade connection and loop connection that inputs and sequentially delays output of said input delay adjustment circuit and parallel outputs output of each of said gate sections in the order of the gate sections from the input side;
   a control circuit that parallel inputs output of each gate section of said first delay circuit bank, synchronizes with said pulse signal, and parallel outputs each result;
   a second delay circuit bank made up of a plurality of gate sections in cascade connection and loop connection arranged in the reverse direction of the signal transmission path of said first delay circuit bank that parallel inputs to each gate section each output of said control circuit in the order of the gate sections from the output side, sequentially delays these inputs, and outputs the result;
   counting means that adds each time a signal corresponding to said pulse signal makes a circuit of the loop within said first delay circuit bank, subtracts each time a signal corresponding to said pulse signal makes a circuit of the loop in said second delay circuit bank, and outputs a signal indicating that the number of circuits completed in said first and second delay circuit banks are equal;

a selector circuit that, in accordance with output of said counting means, extracts from output a signal corresponding to said pulse signal circulating within said second delay circuit bank; and an output delay adjustment circuit that inputs output of said selector circuit, equally adjusts each of said delay time differentials, and outputs the result as one of said delay signals.

6. A multiplex synchronous delay circuit according to claim 5 wherein said counting means comprises:

an adder that adds each time a signal corresponding to the pulse signal makes a circuit of the loop within said first delay circuit bank;

a transmitter that parallel inputs output of said adder, synchronizes with said pulse signal, and parallel outputs each output; and a subtracter that parallel inputs output of said transmitter and subtracts each time the signal corresponding to said pulse signal makes a circuit of the loop within said second delay circuit bank.

7. A multiplex synchronous delay circuit according to claim 1 wherein each of said synchronous delay circuits comprises:

an input delay adjustment circuit that inputs a signal corresponding to said pulse signal and equally adjusts each of said delay time differentials;

a first delay circuit bank made up of a plurality of gate sections in cascade connection that inputs and sequentially delays output of said input delay adjustment circuit and parallel outputs output of each of said gate sections in the order of the gate sections from the input side;

a latch circuit that parallel inputs output of each gate section of said first delay circuit bank, synchronizes with said pulse signal, and latches and parallel outputs each result;

a second delay circuit bank made up of a plurality of gate sections in cascade connection arranged in the same direction as the signal transmission patch of said first delay circuit bank that inputs and sequentially delays said pulse signal and parallel outputs output of each of said gate sections in the order of the gate sections from the input side;

a control circuit that parallel inputs output of each gate section of said second delay circuit bank, controls each input in accordance with each parallel output of said latch circuit, and, wired OR outputs the results; and an output delay adjustment circuit that inputs output of said control circuit, equally adjusts each of said delay time differentials, and outputs the result as one of said delay signals.

8. A multiplex synchronous delay circuit comprising:

a plurality of synchronous delay circuits, wherein input pulse signals are input into a plurality of gate sections in cascade connection within each of said synchronous delay circuits, and said input pulse signals are transmitted through said gate sections in sequential delays, and said gate sections output in parallel and are synchronized with said input pulse signals, and wherein, based on each output in parallel, delay signals output from said plurality of synchronous delay circuits have a fixed delay time corresponding to said input pulse signals, and delay time differentials between said plurality of synchronous delay circuit means are maintained in sequential order; and a multiplex circuit that inputs each of said delay signals, multiplexes said delay signals, and outputs the result as multiplex delay signals.

9. A multiplex synchronous delay circuit according to claim 8 wherein each of said synchronous delay circuit comprises:

an input delay adjustment circuit that inputs a signal corresponding to said pulse signal and equally adjusts each of said delay time differentials;

a first delay circuit bank made up of a plurality of gate sections in cascade connection that inputs and sequentially delays output of said input delay adjustment circuit and parallel outputs output of each of said gate sections in the order of the gate sections starting from the input side;

a control circuit that parallel inputs output of each gate section of said first delay circuit bank, synchronizes with said pulse signal, and parallel outputs each result;

a second delay circuit bank made up of a plurality of gate sections in cascade connection arranged in the reverse direction of the signal transmission path of said first delay circuit bank that parallel inputs to each gate section each output of said control circuit in the order of said gate sections from the output side, sequentially delays these inputs, and outputs the result; and an output delay adjustment circuit that inputs output of said second delay circuit bank, equally adjusts each of said delay time differentials, and outputs the result as one of said delay signals.

10. A multiplex synchronous delay circuit according to claim 9 wherein said second delay circuit bank comprises m rows of delay circuit sub-banks each made up of a plurality of gate sections in cascade connection arranged in the reverse direction of the signal transmission path of said first delay circuit bank, and the (d)th delay circuit sub-bank of said m rows of delay circuit sub-banks includes a circuit for parallel inputting to every (n)th gate section from the output side the output of every (m)th gate section from the (d)th gate section of said control circuit, sequentially delays these inputs, and outputs the result; a circuit for maintaining equal delay time differentials with respect to output of each of these m rows of delay circuit sub-banks and sequentially outputting the result; and a circuit for multiplexing these outputs and outputting the result to said output delay adjustment circuit.

11. A multiplex synchronous delay circuit according to claim 10 wherein said second delay circuit bank comprises:

m sub-output delay adjustment circuits that input output of each of said m rows of delay circuit sub-banks, equally adjust each of said sub-delay time differentials, and output the result; and a sub-multiplex circuit that inputs outputs of said m sub-output delay adjustment circuits, multiplexes said output, and outputs the result.

12. A multiplex synchronous delay circuit according to claim 8 wherein each of said synchronous delay circuits comprises:

an input delay adjustment circuit that inputs a signal corresponding to said pulse signal and equally adjusts each of said delay time differentials;

a first delay circuit bank made up of a plurality of gate sections in cascade connection and loop connection that inputs and sequentially delays output of said input delay adjustment circuit and parallel outputs output of each of said gate sections in the order of the gate sections from the input side;

a control circuit that parallel inputs output of each gate section of said first delay circuit bank, synchronizes with said pulse signal, and parallel outputs each result;

a second delay circuit bank made up of a plurality of gate sections in cascade connection and loop connection arranged in the reverse direction of the signal transmission path of said first delay circuit bank that parallel inputs to each gate section each output of said control circuit in the order of the gate sections from the output side, sequentially delays these inputs, and outputs the result;

counting circuit that adds each time a signal corresponding to said pulse signal makes a circuit of the loop within said first delay circuit bank, subtracts each time a signal corresponding to said pulse signal makes a circuit of the loop in said second delay circuit bank, and outputs a signal indicating that the number of circuits completed in said first and second delay circuit banks are equal;

a selector circuit that, in accordance with output of said counting circuit, extracts from output a signal corresponding to said pulse signal circulating within said second delay circuit bank; and an output delay adjustment circuit that inputs output of said selector circuit, equally adjusts each of said delay time differentials, and outputs the result as one of said delay signals.

13. A multiplex synchronous delay circuit according to claim 12 wherein said counting circuit comprises:

an adder that adds each time a signal corresponding to the pulse signal makes a circuit of the loop within said first delay circuit bank;

a transmitter that parallel inputs output of said adder, synchronizes with said pulse signal, and parallel outputs each output; and a subtracter that parallel inputs output of said transmitter and subtracts each time the signal corresponding to said pulse signal makes a circuit of the loop within said second delay circuit bank.

14. A multiplex synchronous delay circuit according to claim 8 wherein each of said synchronous delay circuits comprises:

an input delay adjustment circuit that inputs a signal corresponding to said pulse signal and equally adjust each of said delay time differentials;

a first delay circuit bank made up of a plurality of gate sections in cascade connection that inputs and sequentially delays output of said input delay adjustment circuit and parallel outputs output of each of said gate sections in the order of the gate sections from the input side;

a latch circuit that parallel inputs output of each gate section of said first delay circuit bank, synchronizes with said pulse signal, and latches and parallel outputs each result;

a second delay circuit bank made up of a plurality of gate sections in cascade connection arranged in the same direction as the signal transmission patch of said first delay circuit bank that inputs and sequentially delays said pulse signal and parallel outputs output of each of said gate sections in the order of the gate sections from the input side;

a control circuit that parallel inputs output of each gate section of said second delay circuit bank, controls each input in accordance with each parallel output of said latch circuit, and wired OR outputs the results; and an output delay adjustment circuit that inputs output of said control circuit, equally adjusts each of said delay time differentials, and outputs the result as one of said delay signals.

* * * * *

UNITED STATES PATENT AND TRADEMARK OFFICE
CERTIFICATE OF CORRECTION

PATENT NO.   : 6,060,920
DATED        : May 9, 2000
INVENTOR(S)  : Takanori Saeki It is certified that error appears in the above-identified patent and that said Letters Patent is hereby corrected as shown below:

Column 4, line 53, delete "w".

Column 8, line 21, delete "M".

Column 8, line 67, after "prior" insert --art--.

Column 9, line 65, delete "20, 20A and 20B," insert --21--.

Column 11, line 67, delete "11A" insert --111A--.

Column 17, line 37, delete "8".

Column 19, line 19, delete "1C" insert --18C--.

Column 23, line 18, delete "id".

Column 25, line 23, delete "_".

Signed and Sealed this

Twenty-second Day of May, 2001

Attest:

NICHOLAS P. GODICI

Attesting Officer    Acting Director of the United States Patent and Trademark Office